(12) United States Patent
Jacob

(10) Patent No.: US 7,515,392 B2
(45) Date of Patent: Apr. 7, 2009

(54) HIGH VOLTAGE CIRCUITS IMPLEMENTED USING LOW VOLTAGE TRANSISTORS

(75) Inventor: Sanish Koshi Jacob, Trivandrum (IN)

(73) Assignee: Texas Instruments Incorporated, Dallas, TX (US)

( * ) Notice: Subject to any disclaimer, the term of this patent is extended or adjusted under 35 U.S.C. 154(b) by 323 days.

(21) Appl. No.: 10/710,692

(22) Filed: Jul. 28, 2004

(65) Prior Publication Data

US 2006/0023378 A1 Feb. 2, 2006

(51) Int. Cl.
*H02H 9/00* (2006.01)
(52) U.S. Cl. .................................. 361/91.1; 361/56
(58) Field of Classification Search ............... 361/91.1, 361/56
See application file for complete search history.

(56) References Cited

U.S. PATENT DOCUMENTS

| | | | |
|---|---|---|---|
| 4,704,547 A | | 11/1987 | Kirsch |
| 5,455,732 A | * | 10/1995 | Davis ........................ 361/90 |
| 7,176,749 B2 | * | 2/2007 | Sharma et al. ............ 327/538 |
| 7,259,609 B2 | * | 8/2007 | Pentakota et al. ......... 327/309 |

OTHER PUBLICATIONS

Hector Sanchez, Joshua Siegel, Carmine Nicoletta, James .p and Nissen ,jose Alvarez, "A Versatile 3.3/2.5/1.8-V CMOS I/O Driver Built in a 0.2-um ,3.5-nm Tox, 1.8-V CMOS Technology" in IEEE Journal of Solid State Circuits vol. 34. pp. 1501-1511, No. 11, Nov. 1999.
Changsik Yoo, Min-Kyu Kim, and Wonchan kim ," A Static Power Saving TTL-to-CMOS Input buffer" in IEEE Journal of Solid State Circuits. vol. 30, pp. 616-620, No. 5, May 1995.

* cited by examiner

*Primary Examiner*—Stephen W Jackson
(74) *Attorney, Agent, or Firm*—Alan K. Stewart; W. James Brady; Frederick J. Telecky, Jr.

(57) ABSTRACT

Transistors of low voltage specification are used to process information in a signal received at a high(er) voltage level. A protection circuit ensures that the cross terminal voltages do not exceed an allowed maximum voltage (e.g., 2.4 V for transistors of 1.8V specification). In an embodiment, the protection circuit contains a PMOS transistor which turns off if a protected cross terminal voltage exceeds such allowed maximum voltage. As a result, protection may be provided while consuming minimal power. The protection circuit may be employed in various types of circuits such as input buffers and logic gates. The protection circuits and the input buffers may potentially be implemented using transistors of a single voltage specification.

7 Claims, 11 Drawing Sheets

| CROSS TERMINALS | VOLTAGE VALUE | COMMENTS |
|---|---|---|
| VDS OF TRANSISTOR 345 | BIASN-VT-VSS | PROTECTED DUE TO TURN OFF OF TRANSISTOR 320 |
| VDG OF TRANSISTOR 345 | BIASN-VT-VSS | PROTECTED DUE TO TURN OFF OF TRANSISTOR 320 |
| VGS OF TRANSISTOR 350 | BIASN-VT-VSS | PROTECTED DUE TO TURN OFF OF TRANSISTOR 320 |
| VDG OF TRANSISTOR 350 | BIASN-VT-VSS | PROTECTED DUE TO TURN OFF OF TRANSISTOR 320 |
| VDS OF TRANSISTOR 360 | HVDD-BIASP-VT | PROTECTED DUE TO TURN OFF OF TRANSISTOR 330 |
| VDG OF TRANSISTOR 360 | HVDD-BIASP-VT | PROTECTED DUE TO TURN OFF OF TRANSISTOR 330 |
| VGS OF TRANSISTOR 355 | HVDD-BIASP-VT | PROTECTED DUE TO TURN OFF OF TRANSISTOR 330 |
| VDG OF TRANSISTOR 355 | HVDD-BIASP-VT | PROTECTED DUE TO TURN OFF OF TRANSISTOR 330 |

*FIG. 4A*

| CROSS TERMINALS | VOLTAGE VALUE | COMMENTS |
|---|---|---|
| VGS OF TRANSISTOR 345 | BIASN-VT-VSS | PROTECTED DUE TO TURN OFF OF TRANSISTOR 340 |
| VDG OF TRANSISTOR 345 | BIASN-VT-VSS | PROTECTED DUE TO TURN OFF OF TRANSISTOR 340 |
| VDS OF TRANSISTOR 350 | BIASN-VT-VSS | PROTECTED DUE TO TURN OFF OF TRANSISTOR 340 |
| VDG OF TRANSISTOR 350 | BIASN-VT-VSS | PROTECTED DUE TO TURN OFF OF TRANSISTOR 340 |
| VGS OF TRANSISTOR 360 | HVDD-BIASP-VT | PROTECTED DUE TO TURN OFF OF TRANSISTOR 310 |
| VDG OF TRANSISTOR 360 | HVDD-BIASP-VT | PROTECTED DUE TO TURN OFF OF TRANSISTOR 310 |
| VDS OF TRANSISTOR 355 | HVDD-BIASP-VT | PROTECTED DUE TO TURN OFF OF TRANSISTOR 310 |
| VDG OF TRANSISTOR 355 | HVDD-BIASP-VT | PROTECTED DUE TO TURN OFF OF TRANSISTOR 310 |

*FIG. 4B*

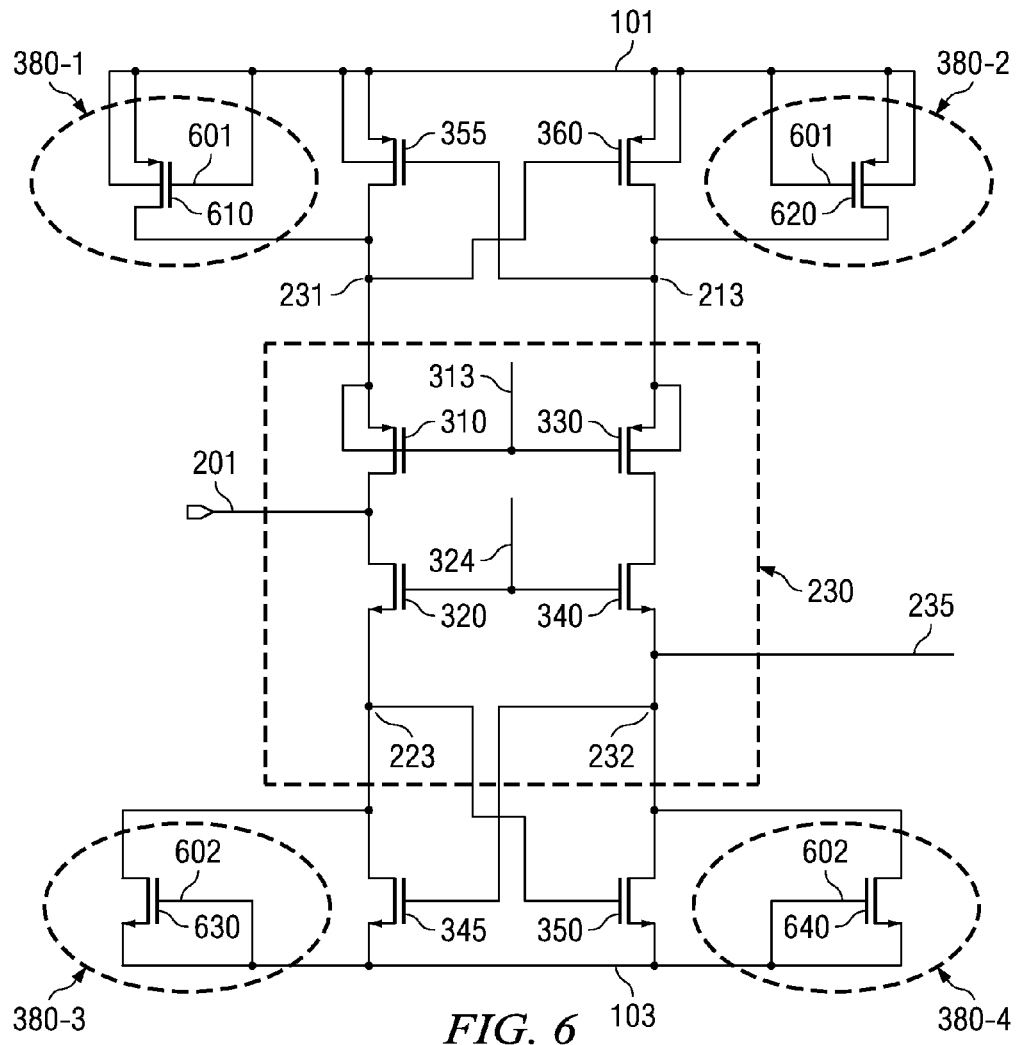
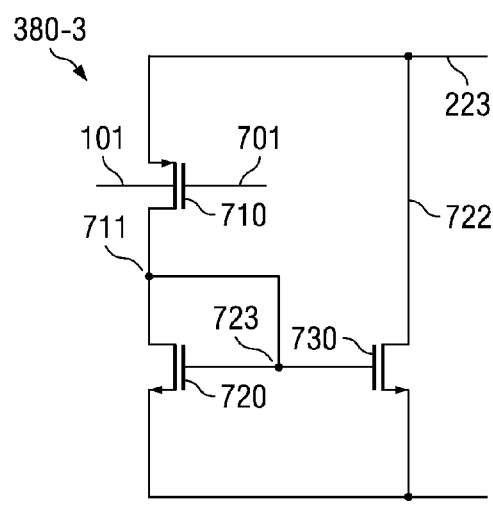
FIG. 6
FIG. 7

US 7,515,392 B2

HIGH VOLTAGE CIRCUITS IMPLEMENTED USING LOW VOLTAGE TRANSISTORS

BACKGROUND OF INVENTION

1. Field of the Invention

The present invention relates to integrated circuits, and more specifically to high voltage circuits implemented using low voltage transistors of reduced number of voltage specifications.

2. Related Art

Integrated circuits are generally provided a supply voltage, and it is some times desirable that a high (compared to voltage specification of a transistor, as described below) voltage be provided for the supply voltage. For example, using a high supply voltage generally provides a correspondingly high signal to noise ratio (SNR), typically leading to less susceptibility to noise in processing input signals. Integrated circuits with high supply voltage may be referred to as high voltage circuits.

Transistors are characterized by associated ideal maximum permissible cross terminal voltages, and such voltages are generally referred to as the voltage specification for the corresponding transistors. For example, it is generally desirable to keep the ideal maximum cross terminal voltage of a 1.8V transistor below 1.8V, even though up to 2.4V is often applied across the terminals of the 1.8V transistor, in which case there is some exposure to reducing the life-time of the transistor, etc. The 2.4V limit may be referred to as allowed maximum voltage.

It is often desirable to implement high voltage circuits using transistors ("low voltage transistors") of low(er) voltage specification. In general, using low voltage transistors provides benefits such as high throughput performance, reduced electrical power consumption, and high density (number of integrated circuits in a unit area). What is therefore needed is a method and apparatus to implement high voltage circuits using low voltage transistors.

BRIEF DESCRIPTION OF DRAWINGS

The present invention will be described with reference to the following accompanying drawings.

FIG. 4A depicts a table containing the details of voltages at cross terminals of each of the transistors forming an input buffer when an input signal is at logic 1.

FIG. 4B depicts a table containing the details of voltages at cross terminals of each of the transistors forming an input buffer when an input signal is at logic 0.

FIG. 6 is a circuit diagram illustrating the details of counter-leakage circuits in another embodiment.

FIGS. 7 and 8 are circuit diagrams together illustrating the details of counter-leakage circuits in one more embodiment.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

Figure 1A:
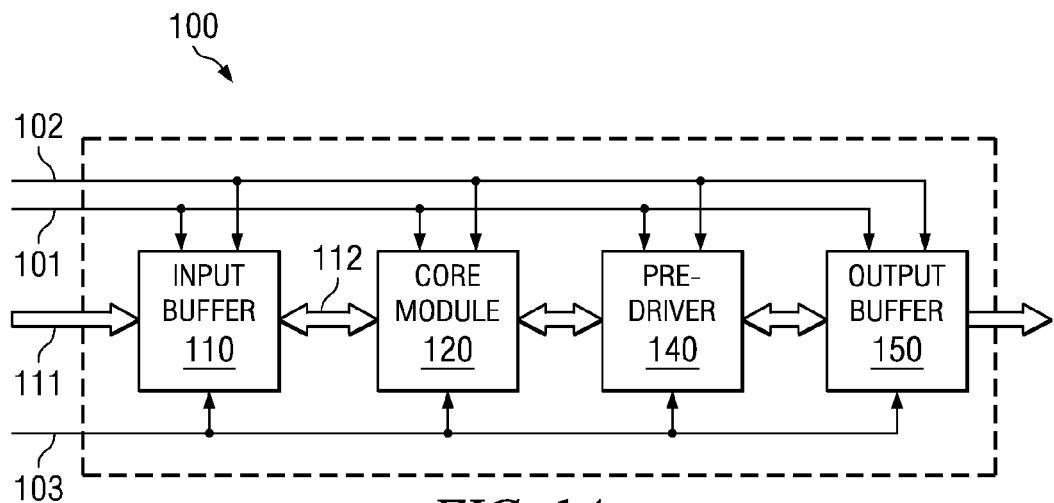
FIG. 1A is a block diagram of an example integrated circuit in which several aspects of the present invention may be implemented.

An aspect of the present invention enables low voltage transistors (transistor of low voltage specification) to process input signals which can be at a high voltage level (higher than the voltage specification of the low voltage transistors) while reducing electrical power consumption. The low voltage transistors may operate with high voltage input signals by providing a protection circuit which ensures that the cross terminal voltages of the low voltage transistors do not exceed a corresponding allowed maximum voltage.

The electrical power consumption may be reduced since the protection circuit may be implemented using transistors which turn off while avoiding exposure of the low voltage transistors to higher than permissible voltage range. The transistors of the protection circuit may also be implemented using transistors of the same voltage specification as the low voltage transistors, thereby reducing the manufacturing complexities and costs.

The approaches of above may be used to implement various types of embodiments. Some example embodiments are described below.

In an embodiment operating as an input buffer receiving an input signal of a first/high voltage level, a first transistor of the second/low voltage specification is protected by a second transistor, with the drain terminal of the second transistor being connected to receive the high voltage input signal and the gate terminal of the second transistor being connected to a bias voltage. The source terminal of the second transistor may be connected to the drain terminal of the first transistor.

Due to such a topology, the second transistor is turned off in some situations to ensure that the low voltage first transistor is not exposed to cross terminal voltages exceeding a corresponding allowed maximum voltage limit. Thus, the second transistor operates as a protection circuit for the first transistor.

The protection circuit may further contain a third transistor with the gate terminal of the third transistor being connected to the bias voltage, and the source terminal of the third transistor being connected to the gate terminal of the first transistor. Due to such connections, the first transistor receives the input signal when the second transistor is off, but the first transistor is not exposed to excessive voltage levels.

An aspect of the present invention enables an input buffer to process input signals of different higher voltage levels merely by changing the supply voltage to the corresponding voltage level. Thus, in an embodiment requiring processing of two input signals of two different high (compared to the voltage specification of the transistors) voltage levels, one input buffer may be connected to a supply voltage equaling the first high voltage and the second input buffer may be connected to a supply voltage equaling the second high voltage, and both input buffers may be implemented using transistors of the same (low) voltage specification.

Such features of an input buffer may be implemented using eight transistors of the same low voltage specification, with four transistors being coupled to operate as an input buffer and the remaining four transistors operating as a protection circuit.

Another aspect of the present invention provides an input buffer and a core module implemented using transistors of a single voltage specification, but processing input signals of higher voltage levels. Due to the use of transistors of single voltage specification, the fabrication complexity and cost can be reduced.

Yet another aspect of the present invention enables implementation of logic gates, which also use transistors of lower voltage specification compared to the voltage of an input signal. A logic gate thus provided may operate on a first input signal which is at a reference voltage to represent one logic value and a first voltage level to represent another logic value. The logic gate may contain multiple transistors coupled to perform the logic operation using the first input, with the transistors being of a voltage specification of a second voltage level, wherein the second voltage level is less than the first voltage level. A protection circuit prevents voltages exceeding an allowed maximum voltage from being applied across any of the transistors.

The logic gate may be implemented in the form of a set of PMOS transistors and a set of NMOS transistors, and an embodiment of the protection circuit may contain a first NMOS transistor and a first PMOS transistor. The source terminal of each of the set of PMOS transistors may be coupled to a supply voltage and the source terminal of each of the set of NMOS terminals may be coupled to the reference voltage. The source terminal of the first PMOS transistor may be connected to the drain terminal of at least one of the set of PMOS transistors, and the source terminal of the first NMOS transistor may be connected to the drain terminal of at least one of the set of NMOS transistors.

The logic gate may further include a swing split circuit receiving the first input signal and generating a first swing signal and a second swing signal. Each swing signal may have a lower swing (voltage difference between high logic level and low logic level) compared to a swing of the first input signal. The first swing signal may be connected to the gate terminal of at least one of the set of PMOS transistors and the second swing signal may be connected to the gate terminal of at least one of the set of NMOS transistors.

Various aspects of the present invention are described below with reference to an example problem. Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well_known structures or operations are not shown in detail to avoid obscuring the invention.

2. Example Integrated Circuit

FIG. 1A is a block diagram of an integrated circuit in which several aspects of the present invention may be implemented. Integrated circuit 100 is shown containing input buffer 110, core module 120, pre-driver 140 and output buffer 150. Each block is described below in further detail.

Input buffer 110 may be implemented using transistors of a voltage specification, which is low compared to the voltage level of input signals received on bus 111. In the description herein, the voltage level of the input signals is conveniently referred to as a high voltage level and the voltage specification of the transistors as a low voltage level.

Input buffer 110 receives an input signal on bus 111 and provides the received input signals on bus 112 with a desired voltage level consistent with the requirements of core module 120. In general, the input signal contains information. The information can be digital (in which case logic level represented is usually of interest) or analog (in which case the changes can be continuous), even though the circuits are described substantially with respect to digital input signals.

Input buffer 110 also receives high voltage supply (HVDD) and low voltage supply (LVDD) respectively on paths 101 and 102 (path 102 shown as two different lines connecting to input buffers 110 and 130 respectively). The voltage level of each of HVDD 101 and LVDD 102 is with respect to a reference voltage (Vss) received on path 103. In the present application, various embodiments are described assuming that the voltage level of HVDD 101 is greater than that of LVDD 102.

Core module 120 and input buffer 110 may be implemented with transistors of same single voltage specification equaling LVDD 102, thereby reducing manufacturing complexity and costs. The manner in which such an implementation may be attained is described in sections below in further detail.

Pre-driver 140 receives input signals from core module 120 with low voltage swing and generates output signals with desired strength to output buffer 150. Pre-driver 140 may also be implemented with low voltage transistors. Logic gate (for example, NAND gate) can be used as a pre-driver). Output buffer 150 provides the output signals to external systems/components. The output signals can be of low or high voltage level. The details of an embodiment of pre-driver are described in a section below in further detail.

Input buffer 110 may be designed to receive input signals of any of multiple voltage levels (e.g., 3.3V, 2.5V, 1.8V, etc.) merely by changing the supply voltage HVDD 101 to the corresponding voltage level. As a result, the same integrated circuit can be used in different environments and/or the same circuit topology of input buffer can be easily used to design/fabricate additional integrated circuits for such different environments. Such a feature may be conveniently used in a scenario when an integrated circuit needs to process input signals of two different high voltages as described below with reference to FIG. 1B.

Figure 1B:
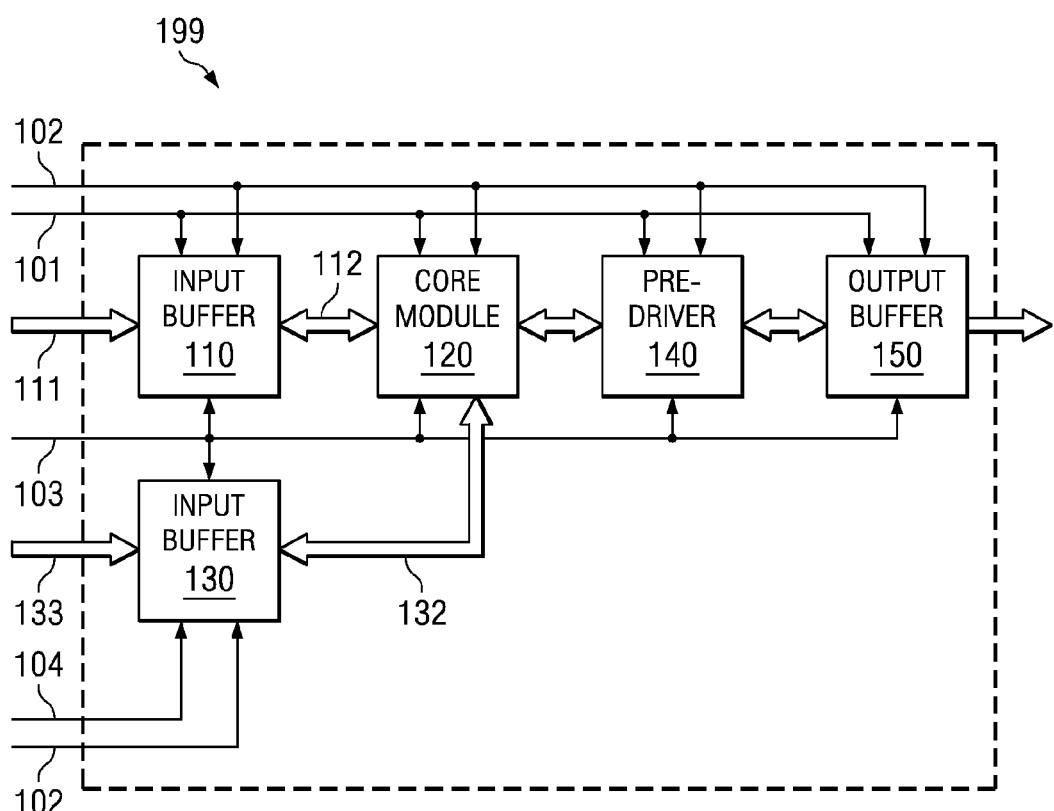
FIG. 1B is a block diagram of an example integrated circuit receiving input signals at different voltage levels in which several aspects of the present invention may be implemented.

With reference to FIG. 1B, integrated circuit 199 is shown containing input buffer 130 apart from the components of FIG. 1A. Integrated circuit 199 receives two input signals on paths 111 and 133 from respective external sources, each with different voltage swing. Input signal 111 is assumed to be changed with a voltage swing of HVDD 101 and input signal 133 is assumed to be changed with a voltage swing of another higher supply voltage HVDD2 received on path 104.

Input buffer 130 receives input signal on path 133 of another high voltage level (i.e., different than input signal 111) and generates a signal with a desired voltage level on path 132 for further processing in core module 120. Input buffer 130 receives HVDD2 on path 104 and also LVDD 102. Input buffer 130 may be implemented similar to input buffer 110.

In an embodiment, input buffers 110 and 130 are implemented with transistors of same voltage specification of transistors of voltage specification of core module 120. Therefore, due to the use of transistors of a single voltage specification, the fabrication complexity and cost can be reduced.

In an alternative embodiment, input buffer 110 and core module 120 are implemented using transistors of same voltage specification and input buffer 130 with transistors of different voltage specification. Thus, integrated circuit 199 can be implemented using transistors of only two different voltage specifications, thereby leading to lower fabrication cost/complexity compared to embodiments using three different voltage specifications.

In addition, input buffers provide the received input signals to core module 120 (even if input signals are received at a voltage higher than LVDD 102) with a voltage level of LVDD 102 without exposing the transistors in input buffers to voltage levels exceeding the corresponding allowed maximum voltages. An example embodiment of such an input buffer is described in sections below with reference to FIG. 2.

It may be helpful to first understand the details of a prior input buffer, which does not include one or more features of the present invention. Accordingly, prior input buffers are described below with reference to FIGS. 1C and 1D.

3. Prior Input Buffers

Figure 1C:
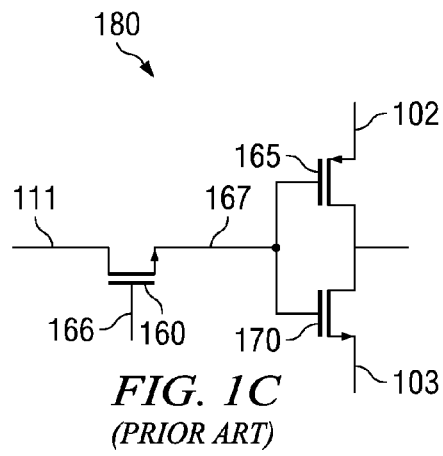
FIG. 1C is a circuit diagram illustrating the details of an embodiment of a prior input buffer.
Figure 1D:
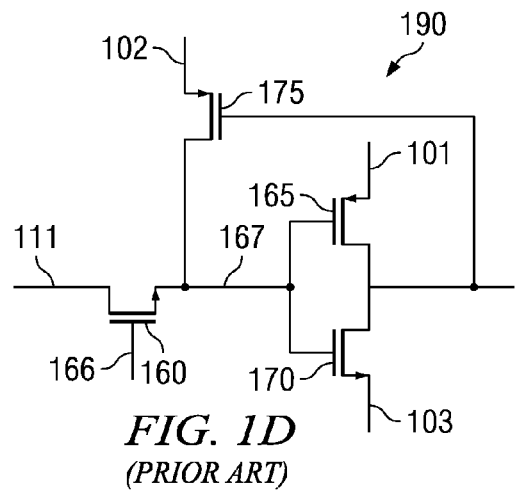
FIG. 1D is a circuit diagram illustrating the details of an alternative embodiment of a prior input buffer.

FIGS. 1C and 1D are circuit diagrams, each illustrating the details of an embodiment of a prior input buffer. Input buffer 180 of FIG. 1C is shown containing NMOS transistors 160 and 170, and PMOS transistor 165. Each component is described below.

Transistors 165 and 170 together operate as an inverter. The source terminal of transistor 165 receives low voltage supply LVDD 102 and the source terminal of transistor 170 receives Vss 103.

NMOS transistor 160 protects transistors 165 and 170 from receiving high voltage input. The drain terminal of transistor 160 receives input signal of high voltage level on path 111 and the gate terminal of transistor 160 is connected to receive bias voltage on path 166. Transistor 160 turns off when input signal 111 is at high voltage level and causes the voltage on path 167 equaling (bias voltage 166−threshold voltage (Vt) of transistor 160), wherein '−' represents a subtraction arithmetic operation. As a result, transistors 165 and 170 do not receive high voltage input. Transistor 160 turns on when input signal 111 is at low voltage level (representing logic 0) and thus same voltage would appear on path 167.

With reference to FIG. 1D, input buffer 190 is shown containing all the components of FIG. 1C and PMOS transistor 175. Transistor 175 ensures complete turn off of transistor 165. Transistor 175 turns on if transistor 165 does not turn off completely, which causes the voltage on path 167 to be pulled to LVDD 102. As a result, transistor 165 turns off completely.

One problem with the input buffers of FIGS. 1C and 1D is that lower (below which the input signal is deemed to represent a logic 0) and upper (above which the input signal is deemed to represent a logic 1) threshold voltage specifications may be hard to achieve. For example, the input buffers of FIGS. 1C and 1D may violate lower and upper threshold voltages of standards such as JEDEC (available at http://www.jedec.org/).

The description is continued with reference to an embodiment of an input buffer according to various aspects of the present invention.

4. Input Buffer

Figure 2:
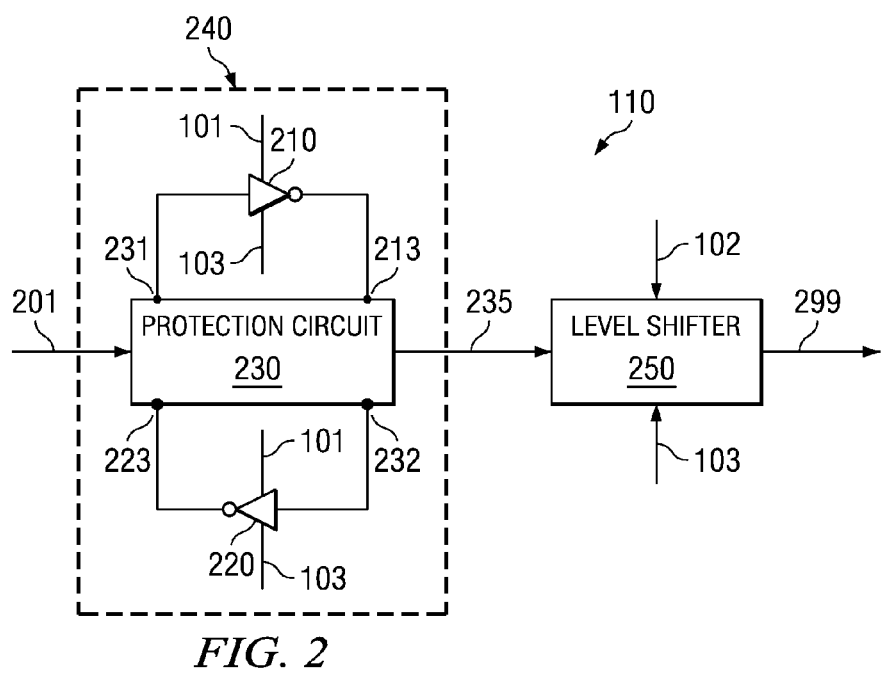
FIG. 2 is a block diagram illustrating the logical view of an input buffer in an embodiment of the present invention.

FIG. 2 is a block diagram illustrating the logical view of input buffer 110 in an embodiment of the present invention. Input buffer 110 is shown containing bus holder 240 and level shifter 250. Bus holder 240 is further shown containing inverters 210 and 220, and protection circuit 230. Each component is described in further detail below.

Bus holder 240 holds the received input signal on path 201 and provides the same input signal on path 235 even if input signal on path 201 turns to an invalid level (after providing the input signal level). For example, if input signal on path 201 may transition to a high impedance (which is invalid logic level), bus holder 240 holds the previous logic level and provides the same on path 235 for further processing. By holding the logic level, the implementation of core module 120 may generally be simplified. Path 201 is contained in bus 111 of FIG. 1.

As noted above, bus holder 240 is shown containing protection circuit 230, in addition to inverters 210 and 220. A pair of inverters can be coupled to operate as a bus holder, as is well known in the relevant arts. According to an aspect of the present invention, inverters 210 and 220 are implemented using transistors of a low voltage specification, and protection circuit 230 operates to ensure that such transistors are not exposed to voltages exceeding the corresponding allowed maximum voltage. Example implementation of bus holder 240 is described below with reference to FIG. 3 in further detail.

Level shifter 250 changes/shifts the voltage level of the signal received on path 235 and provides the level shifted signal on path 299. Path 299 is contained in bus 112 of FIG. 1. In an embodiment, level shifter 250 provides the level shifted signal on path 299 with voltage levels equaling LVDD 102 and Vss 103 corresponding to the respective two logic levels. In an embodiment, level shifter 250 performs inverting operation and bus holder 240 also performs inverting operation, as a result, the output on path 299 represents the same logic level of input signal 201 but with a shift in the voltage level. Example embodiments of level shifter 250 are described in sections below in further detail. The description is continued with reference to an example implementation of input buffer 110 using transistors.

5. Details of Input Buffer

Figure 3:
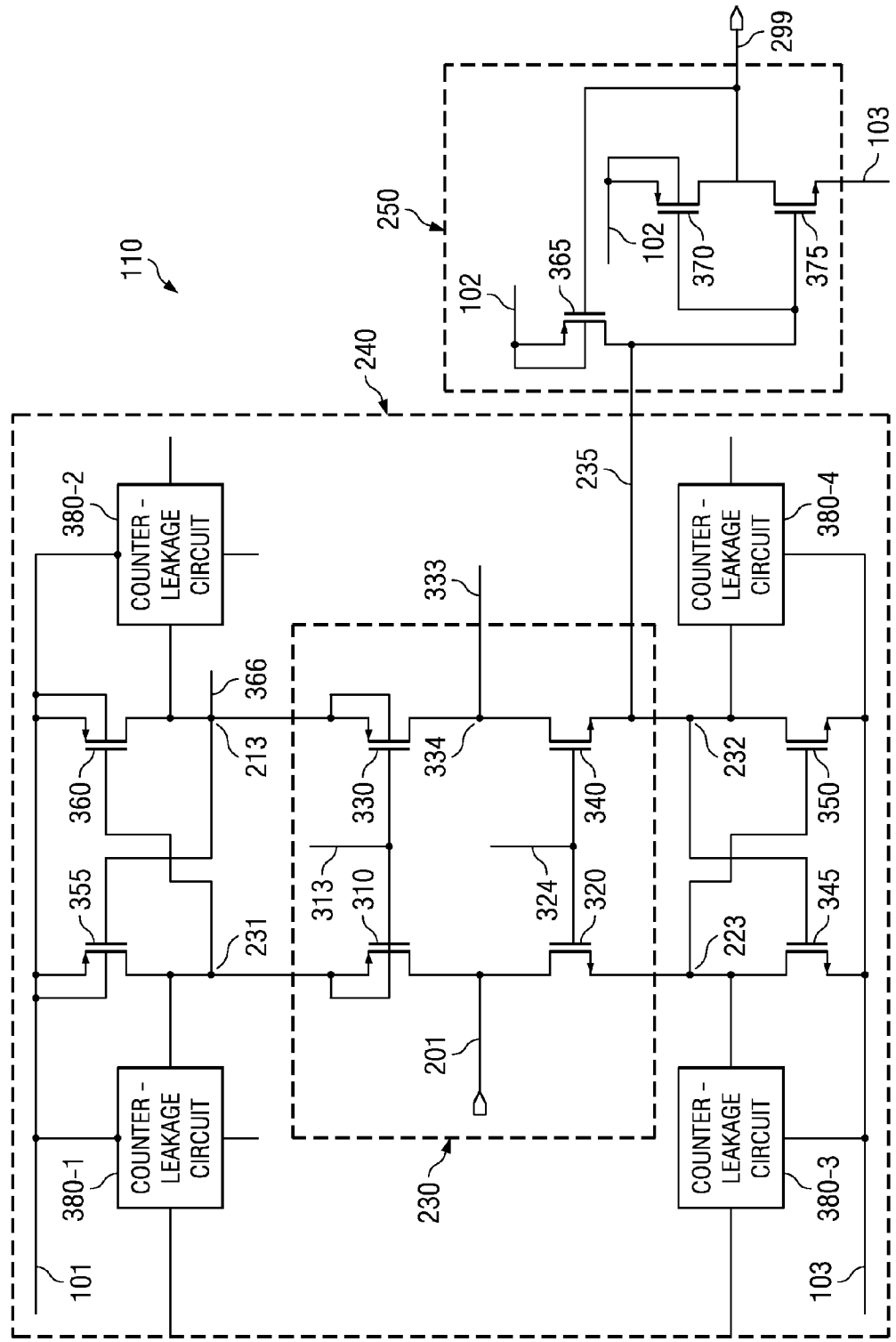
FIG. 3 is a circuit diagram illustrating the details of an input buffer in an embodiment of the present invention.

FIG. 3 is a circuit diagram illustrating the details of input buffer 110 in an embodiment of the present invention. Input buffer 110 is shown containing PMOS transistors 310, 330, 355, 360, 365 and 370, NMOS transistors 320, 340, 345, 350 and 375, and counter-leakage circuits 380-1 through 380-4. Each component is described in detail below.

Transistors 350 and 360 together operate as inverter 210, and transistors 345 and 355 together operate as inverter 220. Transistors 345 and 355 may be implemented with small width/length (W/L) compared to transistors 350 and 360 since inverter 220 (in the feedback path) generally needs to provide a low drive strength. Transistors 310, 320, 330 and 340 together operate as protection circuit 230. Transistors 365, 370 and 375 form level shifter 250. In an embodiment, all the transistors of input buffer 110 are of the same voltage specification, which is lower than the voltage level of the input signal received on path 201.

The drain terminal of each transistor 310 and 320 is connected to receive an input signal of high voltage level on path 201. The source terminal of transistor 320 is connected to the drain terminal of transistor 345 and the gate terminal of transistor 350 at a first node. The gate terminal of each of transistor 320 and transistor 340 is connected to receive a bias voltage BIASN on path 324. The source terminal of each transistor 345 and 350 is connected to Vss 103. The drain terminal of transistor 350 is connected to the source terminal of transistor 340 and the gate terminal of transistor 345 at a second node.

The drain terminal of transistor 340 is connected to the drain terminal of transistor 330. The gate terminal of each transistor 310 and 330 is connected to receive a bias voltage BIASP on path 313. The source terminal of transistor 310 is connected to the drain terminal of transistor 355 and the gate terminal of transistor 360 at a third node. The source terminal of transistor 330 is connected to the drain terminal of transistor 360 and the gate terminal of transistor 355 at a fourth node. The source terminal of each of transistor 355 and transistor 360 is connected to HVDD 101.

The bulk terminal of each of transistor 355, transistor 360, transistor 310 and transistor 330 is connected to the corresponding source terminal. However, the bulk terminals of transistors 310 and 330 can be connected to HVDD 101 in alternative embodiments. The bulk terminals of transistors 310 and 330 are connected to nodes 231 and 213 respectively so as to improve Vt by eliminating the body effect. Body effect generally refers to the increase in Vt when the source terminal of a PMOS transistor is at lower voltage than that at substrate. An increase in Vt reduces the throughput performance, and therefore elimination of body effect is desirable.

The operation of each transistor is described below with reference to the manner in which each transistor is not exposed to cross terminal voltages exceeding an allowed maximum voltage in the case of both transitions (0 to 1, and 1 to 0). For illustration, it is assumed that the voltage level corresponding to logic 1 equals HVDD and logic 0 equals Vss.

It is helpful to first appreciate that transistors 320, 330, 345 and 360 are in an OFF state and transistors 310, 340, 350 and 355 are in an ON state when the input signal is at 1. Similarly, transistors 320, 330, 345 and 360 are in an ON state and transistors 310, 340, 350 and 355 are in an OFF state when input signal 201 is at logic 0. In addition, in the steady state of 1 on input signal, nodes 223, 232, 213 and 231 are respectively at voltage levels (BIASN−Vt of transistor 320), Vss 103, (BIASP+Vt of transistor 330) and HVDD.

Similarly, in the steady state of 0 on the input signal, nodes 223, 232, 213 and 231 are respectively at voltage levels Vss 103, (BIASN−Vt of transistor 340), HVDD and (BIASP+Vt of transistor 310). Both at the steady state and during the transitions, the transistors are not exposed to cross terminal voltages exceeding allowed maximum voltage, as described below briefly.

The description is continued with respect to state changes when the input signal transitions to 1, and the manner in which transistors (forming input buffer) may be protected by the protection circuit.

6. Protection when Input Signal Transitions to Logic 1

FIG. 4A is a table illustrating the details of voltages at cross terminals of each of the transistors forming input buffer 110 when the input signal transitions to logic 1. The table is shown containing the voltages across only terminals that need to be protected, and the voltages across the remaining terminals are not shown in the interest of conciseness. The manner in which the transistors may be protected when input signal transitions to logic 1 is described below with reference to FIGS. 3 and 4A.

Transistor 320 turns off when input signal 201 transitions to logic 1 (HVDD) and voltage at node 223 reaches BIASN−Vt (of transistor 320). Voltage at node 223 would have been at Vss when input signal was at logic 0, and raises from Vss to (BIASN−Vt of transistor 320) since HVDD provided at drain terminal of transistor 320 causes current to flow through transistor 320.

Even though the voltage at node 223 initially (responsive to input signal being at logic 0) is at Vss (which causes the drain to source voltage across transistor 320 to equal high voltage of HVDD), the voltage raises to (BIASN−Vt) within a short duration along with the transition of input signal to logic 1. As a result, the drain to source voltage across transistor 320 may not be exposed to high voltage.

Transistor 345 may be protected due to the turning off of transistor 320. In particular, the drain to source voltage (Vds) across transistor 345 would not be greater than (BIASN−Vt of transistor 320), and thus transistor 345 is protected as summarized in row 410-1 of FIG. 4A. By appropriate choice of value for BIASN (and perhaps Vt), the range of voltages for input signals and/or the desired voltage specification for transistor 345 can be determined. The drain to gate voltage (Vdg) across transistor 345 would also not be greater than (BIASN−Vt of transistor 320), and thus transistor 345 is protected as summarized in row 410-2 of FIG. 4A (assuming Vss=0).

Transistor 350 is also protected from exposure to excessively high cross terminal voltages due to the turning off of transistor 320. In particular, gate to source voltage (Vgs) and Vdg across transistor 350 would also not be exposed to a voltage greater than (BIASN−Vt) as summarized in rows 410-3 and 410-4 respectively of FIG. 4A.

Transistor 330 turns off when input signal is at logic 1 and voltage at node 231 reaches HVDD. HVDD on path 201 causes current to flow through transistor 310, which in turn causes the voltage at node 231 to raise/increase from BIASP+Vt (of transistor 310). The increase in voltage at node 231 causes transistor 310 to be turned on and transistor 360 to be turned off.

Transistor 360 is protected due to turning off of transistor 330. In particular, each of Vds and Vdg across transistor 360 would not be greater than (HVDD−BIASP−Vt of transistor 330), and this transistor 360 is protected as summarized in rows 410-5 and 410-6 respectively of FIG. 4A.

Transistor 355 is also protected due to turning off of transistor 330. In particular, Vgs and Vdg across transistor 355 would not be exposed to a voltage greater than (HVDD−BIASP−Vt of transistor 330) as summarized in rows 410-7 and 410-8 respectively of FIG. 4A. By appropriate choice of value for BIASP, the range of voltages for input signals and/or the desired voltage specification for transistors 355 and 360 can be determined.

Therefore, it may be appreciated that transistors 345 and 350 are protected due to turning off of transistor 320 and transistors 355 and 360 are protected due to turning off of transistor 330. In addition, as the transistors in the protection circuit are off during protection, power consumption may be reduced.

The description is continued with respect to state changes when the input signal transitions to 0, and the manner in which transistors (forming input buffer) may be protected by the protection circuit.

7. Protection when Input Signal Transitions to Logic 0

FIG. 4B is a table illustrating the details of voltages at cross terminals of each of the transistors forming input buffer 110 when input signal is at logic 0. The table is shown containing the voltages across terminals that need to be protected, and the voltages across the remaining terminals are not shown in the interest of conciseness. The manner in which the transistors may be protected when input signal transitions to logic 0 is described below with reference to FIGS. 3 and 4B.

Transistor 340 turns off when input signal 201 is at logic 0 and the voltage on node 232 reaches Vss. In particular, transistor 320 is turned on when input signal transitions to logic 0 since gate terminal of transistor 320 is connected to BIASN. The turning on of transistor 320 turns off transistor 350, which causes transistor 340 to be turned off since no current flows through transistor 340.

Transistor 345 is protected due to turning off of transistor 340. In particular, Vgs and Vdg of transistor 345 would not be exposed to a voltage greater than (BIAS−Vt of transistor 340-Vss) as summarized in rows 430-1 and 430-2 respectively of FIG. 4B.

Transistor 350 is also protected due to turning off of transistor 340. In particular, Vdg and Vds of transistor 350 would not be exposed to a voltage greater than (BIASN−Vt of transistor 340-Vss), and thus transistor 350 is protected as summarized in rows 430-3 and 430-4 respectively of FIG. 4B.

Transistor 310 turns off when input signal transitions to logic 0 since the voltage at node 231 is pulled towards Vss (logic 0). However, when voltage on node 231 reaches BIASP+Vt, transistor 310 turns off and thus does not allow node 231 to go below (BIASP+Vt of transistor 310).

Transistor 360 is protected due to turning off of transistor 310. In particular, Vgs and Vdg of transistor 360 would not be exposed to a voltage greater than (HVDD−BIASP−Vt of transistor 310) as summarized in rows 430-5 and 430-6 respectively of FIG. 4B.

Transistor 355 is also protected due to turning off of transistor 310. In particular, Vds and Vdg of transistor 355 would not be exposed to a voltage greater than (HVDD−BIASP−Vt of transistor 310) as summarized in rows 430-7 and 430-8 respectively of FIG. 4B.

Therefore, it may also be appreciated that transistors 345 and 350 are protected due to turning off of transistor 340 and transistors 355 and 360 are protected due to turning off of transistor 310.

It may be noted that the voltage levels of BIASN and BIASP are chosen such that the voltage across terminals of transistors does not exceed the allowed maximum voltage. In an embodiment, the voltage level of each of BIASN and BIASP equals half of HVDD 101. For example, assuming that HVDD equals 3.3V and all the transistors are of 1.8V specification, then BIASN and BIASP equals 1.65V, which is less than the allowed maximum voltage of 2.4V of a 1.8V transistors.

However, BIASN can be chosen to be slightly greater than half of HVDD and BIASP can be chosen slightly lesser than half of HVDD such that the voltage swing of first intermediate signal and second intermediate signal on paths 366 and 235 would be large. While transistors 310, 320, 330 and 340 operate as a protection circuit as described above, transistors 345, 350, 355 and 360 together continue to operate as an input buffer as described below.

8. Operation as Input Buffer

When input signal carries logic 1, transistor 350 is turned on since the voltage (BIASN−Vt) at node 223 (due to turning off of transistor 320) is applied to gate terminal of transistor 350. As a result, node 232 is pulled to Vss, which causes transistor 345 to be tuned off and transistor 340 to be turned on since gate terminal of transistor 340 is connected to BIASN (324). As a result, the voltage on path 235 equals Vss, which represents logic 0. Since transistor 340 is turned on, the voltage at node 334 also equals Vss representing logic 0.

A logic 1 on input signal 201 causes transistor 310 to be turned on, which turns off transistor 360. The turning off of transistor 360 causes the voltage on node 213 to be reduced from HVDD and causes transistor 330 to be turned off. As a result, the voltage on node 213 equals (BIASP+Vt of transistor 330). The voltage (BIASP+Vt) on node 213 represents logic 0.

Therefore, when the input signal transitions to logic 1, the voltages on paths 235, 333 and 366 respectively equals Vss, Vss and (BIASP+Vt), and each represents logic 0.

When input signal transitions to logic 0, transistor 320 is turned on, which turns off transistor 350. The turning off of transistor 350 causes transistor 340 to be turned off since no current flows through transistor 340. As a result, the voltage at node 232 (on path 235) equals (BIASN−Vt of transistor 340), which represents logic 1.

Continuing with input signal is at logic 0, the voltage (BIASP+Vt) at node 231 (due to turning off of transistor 310) turns on transistor 360 and causes the voltage at node 213 to be pulled to HVDD 101. The voltage at node 213 turns off transistor 355, which in turn turns on transistor 360 completely. The voltage on node 213 turns on transistor 330. As a result, the voltage equaling HVDD 101 is provided at node 213, which represents logic 1. Since transistor 330 is turned on and transistor 340 is turned off, the voltage at node 334 also equals HVDD.

Therefore, when input signal transitions to logic 0, the voltages on paths 235, 333 and 366 respectively equals BIASN−Vt, HVDD and HVDD, and each represents logic 1.

It may be observed that the voltage at node 334 (provided as a third intermediate signal on path 333) switches between HVDD and Vss. The output at node 334 can be used to operate bus holder 240 as a high voltage inverter. Similarly, the voltage at node 232 (provided as a second intermediate signal on path 235) switches between BIASN−Vt and Vss. The output at node 232 can be used as an input to level shifter 250 since the change in voltage levels is less than that of at node 334. Similarly, the voltage at node 213 (provided as first intermediate signal on path 366) switches between HVDD and BIASP+Vt, which may be used as an input signal as described in sections below. The change in voltage levels is also small at node 213 and thus the output at node 213 can be used as a low voltage inverter output.

It may be appreciated that input buffer 110 may not require a charged device model (CDM) clamp since input signals are received on a drain terminal of a transistor instead of a gate terminal. In general, when inputs are received on gate terminals, a CDM clamp may be required in input buffers to protect gate terminals of transistors not to receive unwanted inputs through electrostatic discharge (ESD) strike, as is well known in the relevant arts.

It may be further noted that the voltages at nodes 231, 213, 232 and 223 may go lower or higher than the desired voltage due to several factors. Some of such factors include sub-threshold leakage through off transistors, drain to bulk reverse biased diode, noise coupling via parasitic capacitance typically present at nodes, etc.

As an illustration, voltage at node 231 may fall below BIASP+Vt if (current due to the sub-threshold leakage of transistor 310+current due to drain to bulk reverse biased diode of transistor 310+current due to noise coupled via parasitic capacitance at node 231) is less than the current due to the sub-threshold leakage through transistor 355. Otherwise the voltage at node 231 may go above BIASP+Vt. Such changes in voltage levels may cause undesirably high voltage levels to be presented across terminals of transistors, which may reduce the life time of transistors.

In general, it should be appreciated that the circuit topology of FIG. 3 can be used to process input signals of different voltages by using the corresponding supply voltage and by selecting the transistors of appropriate W/L ratios. Such processing can be performed using low voltage transistors, as also described above.

In addition, the approaches described above provide greater control over the upper and low thresholds of the input signals since the size (W/L ratio) of transistors 360 and 350 can be adjusted to attain desired lower and upper thresholds. Such a feature enables the circuit of FIG. 3 to be adapted to the requirements of standards such as JEDEC, noted above. Furthermore, since the upper/lower specifications are generally specified with reference to supply voltage (HVDD 101), the circuit of FIG. 3 advantageously tracks variations in the supply voltage since transistor 360, connected to HVDD, controls (in combination with transistor 350) the threshold voltages.

Counter-leakage circuits 380-1 through 380-4 may prevent respective nodes 231, 213, 223 and 232 from going below or above the desired voltage level. The manner in which counter-leakage circuits may be implemented according to several aspects of the present invention is described in sections below. The description is continued with reference to level shifting of the voltage on path 235.

Transistors 370 and 375 receive the second intermediate signal on path 235 on respective gate terminals. When voltage on path 235 equals (BIASN−Vt) (logic 1), transistor 375 is on and transistor 370 is off, and the output on path 299 equals Vss 103. When voltage on path 235 equals Vss (logic 0), transistor 375 is off and transistor 370 is on, and the output on path 299 equals LVDD 102. Therefore, the voltage on path 299 switches between LVDD and Vss as desirable for the operation of core module 120.

Transistor 365 prevents leakage when transistor 370 is not completely turned off. As an illustration, when voltage (BIASN−Vt) on path 235 corresponding to logic 1 is below LVDD, then transistor 370 will not turn off completely. In such a case, voltage on path 299 is less than LVDD, which turns on transistor 365. The turning on of transistor 365 connects gate terminals of transistors 370 and 375 to LVDD, which turns off transistor 370 completely. However, transistor 365 itself causes leakage of current from HVDD 101 when voltage on path 235 is greater than LVDD+Vt (of transistor 365). Such leakage may be reduced according to various aspects of the present invention as described below with reference to FIG. 4C.

9. Level Shifter

Figure 4C:
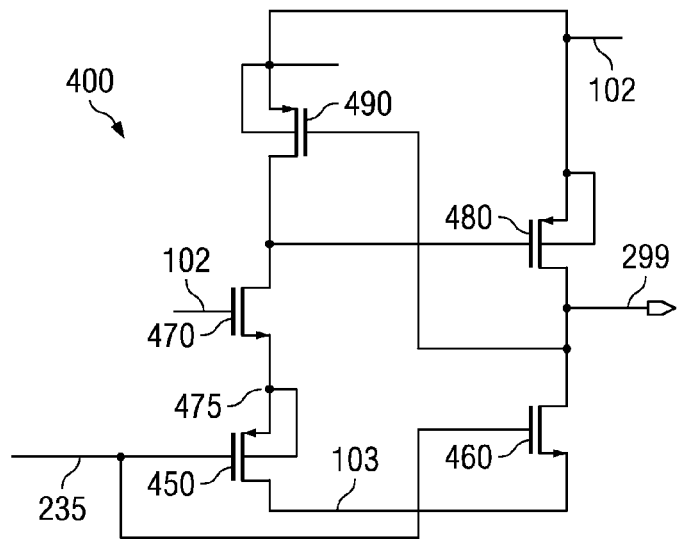
FIG. 4C is a circuit diagram illustrating the details of a level shifter in an embodiment of the present invention.

FIG. 4C is a circuit diagram illustrating the details of level shifter in an embodiment of the present invention. The structure of level shifter 400 is similar to the structures described in a paper entitled as "A Static Power Saving TTL_to_CMOS Input buffer", authors: Changsik Yoo, Minimum_Kyu Kim, and Wonchan kim, published in IEEE J. Solid State Circuits, Vol 30, pp. 616_620, No. 5, May 1995, which are intended to reduce static power consumption. However, level shifter 400 changes the voltage level of the second intermediate signal received on path 235 while reducing leakage current as described below in further detail.

Level shifter 400 is shown containing PMOS transistors 450, 480 and 490, and NMOS transistors 460 and 470. The gate terminal of transistor 470 and source terminals of transistors 480 and 490 are connected to LVDD 102, and the drain terminals of transistor 450 and the source terminal of transistor 460 are connected to Vss 103. The operation of each component is described with reference to the two logic levels of signal received on path 235.

When voltage level of signal 235 equals BIASN−Vt (representing logic 1), transistor 450 turns off and transistor 460 turns on. The turning on of transistor 460 pulls path 299 to Vss, which represents logic 0, as desired. The pull on path 299 turns on transistor 490, which turns off transistor 480.

Transistor 470 ensures that transistor 450 is turned off completely, which may otherwise cause leakage. Transistor 470 is turned on since the gate terminal of transistor 470 is connected to LVDD 102. The voltage at node 475 equals (LVDD−Vt of transistor 470). Since the gate terminal of transistor 460 receives BIASN−Vt and the source terminal receives LVDD−Vt, transistor 450 remains off.

When voltage level of signal 235 equals Vss (representing logic 0), transistors 450 and 470 turn on and transistor 460 turns off, which causes transistor 480 to be turned on. The turning on of transistor 480 provides LVDD on path 299, as desirable. LVDD on path 299 turns off transistor 490.

It may be noted that the voltage on path 299 switches between LVDD and Vss as desirable, even though the voltage on path 235 switches between BIASN−Vt and Vss. It may be further noted that the transistors that receive signal on path 235 are not connected to LVDD and thus leakage may be prevented. For example, transistor 450 which is connected to path 235, is not connected to LVDD. The description is continued with reference to several embodiments of counter-leakage circuits.

10. Counter-leakage Circuit

Figure 5:
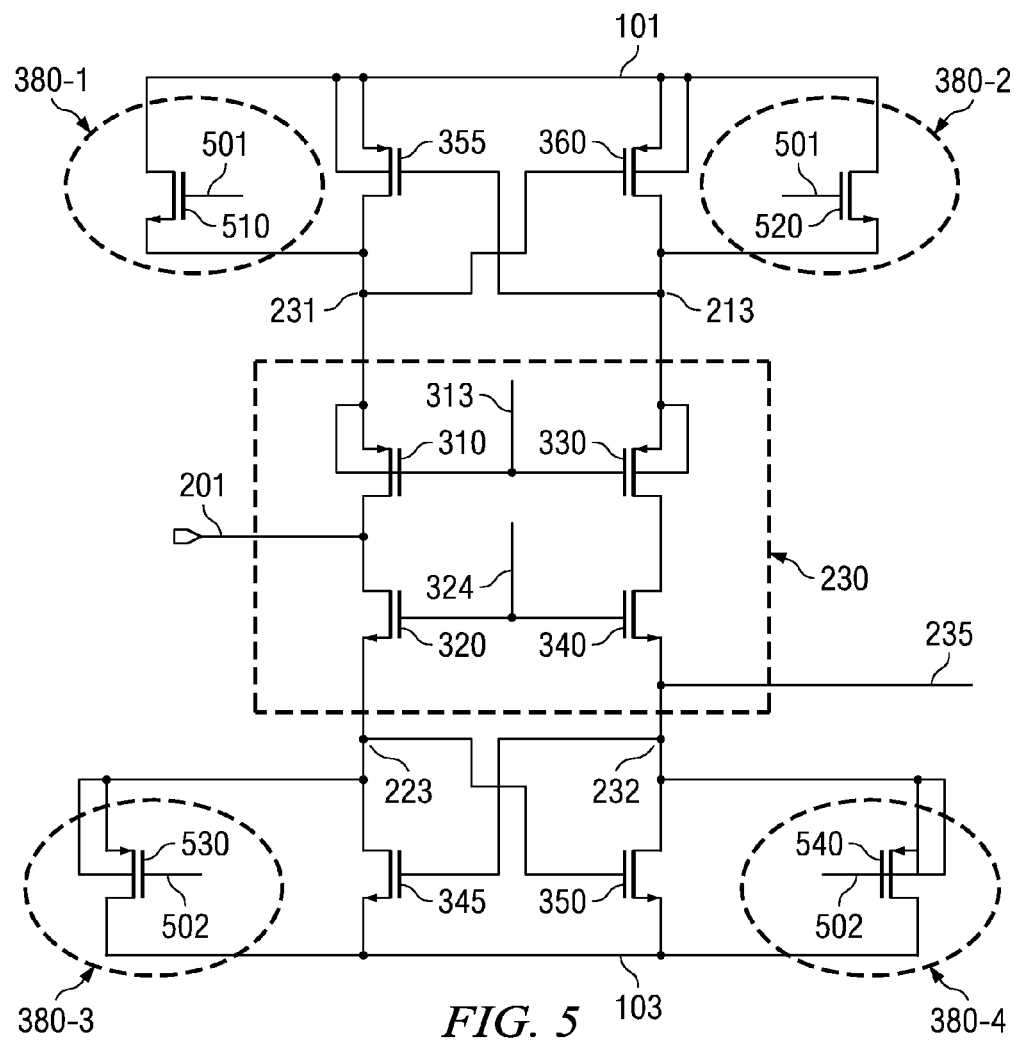
FIG. 5 is a circuit diagram of a bus holder illustrating the details of counter-leakage circuits in an embodiment.

FIG. 5 is a circuit diagram of bus holder 240 illustrating the details of an embodiment of counter-leakage circuits 380-1 through 380-4 according to several aspects of the present invention. Counter-leakage circuits 380-1 through 380-4 are shown containing NMOS transistors 510 and 520, PMOS transistors 530 and 540 respectively. As described above, each counter-leakage circuit 380-1 through 380-4 prevents the voltages at respective nodes 231, 213, 223 and 232 from rising above or falling below the desired voltage level. Each component is described below.

Transistor 510, connected at node 231, may prevent the voltage at node 231 from falling below (BIAS1−Vt of transistor 510). The gate terminal of transistor 510 is connected to BIAS1 (generally a fixed voltage connected to the gate terminal of transistors 510 and 520) received on path 501. Source terminal and drain terminal of transistor 510 are connected respectively to node 231 and HVDD 101. Transistor 510 turns on when voltage at node 231 falls below (BIAS1−Vt of transistor 510).

The turning on of transistor 510 causes the voltage at node 231 to equal (BIAS1−Vt) and thus prevents the voltage at node 231 from falling below BIAS1−Vt. As a result, any leakage in transistor 310 in an off state (which may cause the voltage at node 231 to go below (BIASP+Vt)) is countered by current flow through transistor 510. Similarly, transistor 520 connected at node 213 limits the voltage not to fall below (BIAS1−Vt of transistor 520).

Transistor 530, connected at node 223, may prevent the voltage at node 223 from rising above (BIAS2+Vt of transistor 530). Gate terminal of transistor 530 is connected to BIAS2 received on path 502. Source terminal and drain terminal of transistor 530 are connected respectively to node 223 and Vss 103. Transistor 530 turns on when voltage at node 223 rises above (BIAS2+Vt of transistor 530).

The turning on of transistor 530 causes the voltage at node 223 to equal (BIAS2+Vt) and thus prevents the voltage at node 223 from rising above (BIAS2+Vt). As a result, any leakage in transistor 320 in an off state (which may cause the voltage at node 223 to go above (BIASN−Vt)) is countered by current flow through transistor 530. Similarly, transistor 540 connected at node 232 limits the voltage from rising above (BIAS2+Vt of transistor 540).

The voltage level of BIAS1 501 and BIAS2 502 are selected such that the voltage across terminals of transistors connected to corresponding nodes does not exceed the allowed maximum voltage level. For example, each of BIAS1 and BIAS2 does not exceed the maximum allowed gate to bulk voltage limit (e.g., 2.4V for 1.8V transistor) of the transistors. By limiting the voltage levels at nodes 231, 213, 223, and 232, counter-leakage circuits 380-1 through 380-4 may counter-leakage due to various factors as described above.

It may be noted that counter-leakage circuits 380-1 through 380-4 may consume substantially low power since the transistors in counter-leakage circuits are turned on only when the voltage at a corresponding node falls below or rises above the desired voltage level. The description is continued with reference to an alternative embodiment of counter-leakage circuit.

11. Alternative Embodiment of Counter-leakage Circuit

FIG. 6 is a circuit diagram containing bus holder 240 illustrating an embodiment of counter-leakage circuits 380-1 through 380-4 according to several aspects of the present invention. Counter-leakage circuits 380-1 through 380-4 are shown containing PMOS transistors 610 and 620, NMOS transistors 630 and 640 respectively. As described above, each counter-leakage circuit 380-1 through 380-4 prevents the voltage at respective nodes 231, 213, 223 and 232 from rising above or falling below the desired voltage level. Each component is described below.

Transistor 610, connected at node 231, may prevent the voltage at node 231 from falling below (BIASP+Vt). Gate terminal and source terminal of transistor 610 are connected to HVDD 101 and drain terminal is connected to node 231. As a result, transistor 610 is permanently off. The sub-threshold leakage current through transistor 610 increases if voltage at node 231 decreases below (BIASP+Vt). By appropriate design (e.g., large W/L) of transistor 610, the sub-threshold leakage can be made to be sufficiently large to ensure that the voltage at node 231 does not fall below (BIASP+Vt). Similarly, transistor 620 connected at node 213 may prevent the voltage at node 213 from falling below (BIASP+Vt).

Transistor 630 is connected at node 223 may prevent the voltage at node 223 from rising above (BIASN−Vt). Gate terminal and source terminal of transistor 630 are connected to Vss 103 and drain terminal is connected to node 223. As a result, transistor 630 is permanently off. The sub-threshold leakage current through transistor 630 increases if voltage at node 223 rises above (BIASN−Vt). Due to the sub-threshold leakage, the voltage at node 223 may no be allowed to rise above (BIASN−Vt). Similarly transistor 640 connected at node 232 may prevent the voltage at node 232 from rising above (BIASN−Vt).

It may be noted that counter-leakage circuits 380-1 through 380-4 may consume substantially low power since the transistors in counter-leakage circuits are permanently turned off. The description is continued with reference to an alternative embodiment of counter-leakage circuit.

12. Alternative Embodiment of Counter-leakage Circuit

Figure 8:
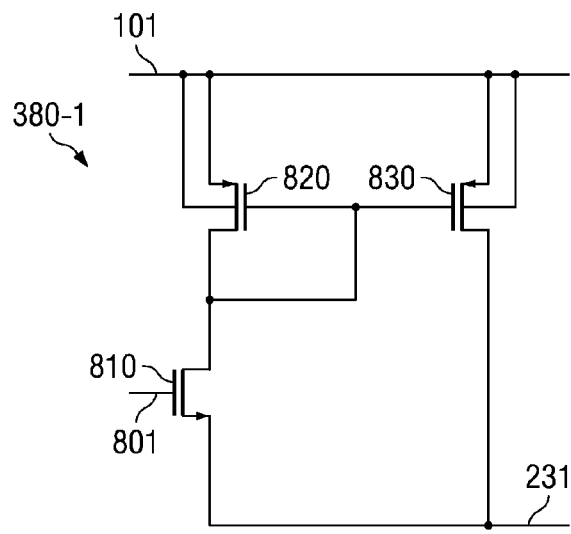

FIGS. 7 and 8 are circuit diagrams together illustrating the details of counter-leakage circuits 380-1 through 380-4 in one embodiment. In particular, FIG. 7 is a circuit diagram illustrating the details of counter-leakage circuit 380-3 and FIG. 8 is a circuit diagram illustrating the details of counter-leakage circuit 380-1.

For conciseness, only counter-leakage circuits 380-1 and 380-3 are described herein. However, counter-leakage circuits 380-2 and 380-4 may also be implemented similar to 380-1 and 380-3 respectively.

With reference to FIG. 7, counter-leakage circuit 380-3 is shown containing PMOS transistor 710 and NMOS transistors 720 and 730. Each component is described below.

PMOS transistor 710 receives the signal at node 223 on source terminal, and BIAS1 voltage on gate terminal 701 (similar to BIAS1 on path 501). In an embodiment, BIAS1 equals (BIASN−|vt| of transistor 320), (wherein |x| represents the absolute value of x) which causes transistor 710 to be turned on when signal 223 is greater than or equal to (BIASN−Vt). Transistor 710 draws high current when turned on, and operates as a open switch otherwise.

Transistors 720 and 730 together operate as a current amplifier. Gate terminal of transistor 730 is connected to the drain terminal of transistor 720. The source terminals of the two transistors are connected to Vss 103. The drain terminals of transistors 720 and 730 are respectively connected to paths 711 and 722. The drain and gate terminals of transistor 720 are shorted.

Transistor 730 is designed to be K times the size of transistor 720. Transistor 720 generates a bias such that the current on path 722 is K times the current on path 711 when voltage at node 223 equals (BIASN−Vt), as described below.

When the voltage on node 223 is lesser than (BIASN−Vt), no (negligible amount of) current flows on path 711. As a result, the voltage at node 723 is closer to Vss 103, which turns off transistor 730. Thus, low current is drawn on line 722 when the voltage on node 223 is less than (BIASN−Vt).

When the voltage on node 223 equals (BIASN−Vt), current flows on path 711, which increases the voltage at node 723. Transistor 730 is turned on as a result, and draws current on path 722. As would be apparent to one skilled in the relevant arts, the larger size (K times) of transistor 730 would cause the current on path 722 to equal K times the current drawn on path 711.

Therefore, counter-leakage circuit 380-3 draws from path 722 (and thus 223) a large amount of current when PMOS transistor 710 conducts (i.e., when there is current on path 711). The drawing of such a large amount of current enables the voltage on node 223 to be limited to the desired voltage level (BIASN−Vt) when voltage on node 223 rises above (BIASN−Vt). As a result, any leakage in transistor 320 in an off state (which may cause the voltage at node 223 to rise above (BIASN−Vt)) is countered by current flow through transistor 730.

In addition, counter-leakage circuit 380-3 may not draw any current when PMOS transistor 710 does not conduct (when voltage on node 223 is less than (BIASN−Vt)). As a result, counter-leakage circuit 380-3 may not affect the voltage on node 223 when voltage level is less than (BIASN−Vt).

Furthermore, PMOS transistor 710 can be chosen to be of small size, thereby not providing substantial parasitic capacitance. In addition, transistors 720 and 730 may also provide low parasitic capacitance since both transistors 720 and 730 are implemented as NMOS transistors. Counter-leakage circuit 380-3 consumes substantially low power since counter-leakage circuit 710 draws current only when voltage on node 223 rises above (BIASN−Vt).

With reference to FIG. 8, counter-leakage circuit 380-1 is shown containing NMOS transistor 810 and PMOS transistors 820 and 830. Each component is described below.

For conciseness, the similarity of components are described with reference to FIG. 7. Transistors 810, 820 and 830 operate similar to transistors 710, 720 and 730 of FIG. 7. NMOS transistor 810 receives the signal at node 231 on source terminal, and BIAS2 voltage on gate terminal 801 (similar to BIAS2 on path 502). In an embodiment, BIAS2 equals (BIASP+|Vt| of transistor 310), which causes transistor 810 to be turned on when signal 231 is less than or equal to (BIASP+Vt of transistor 310).

Transistor 810 draws high current when turned on, and operates as a open switch otherwise. Transistors 820 and 830 operate as a current amplifier and draws more current when voltage on node 231 falls below (BIASP+Vt of transistor 310). Therefore, counter-leakage circuit 380-1 prevents the voltage at node 231 from falling below (BIASP+Vt of transistor 310). The description is continued with reference to another alternative embodiment of counter-leakage circuits 380-1 through 380-4.

13. Another Alternative Embodiment of Counter-leakage Circuit

Figure 9:
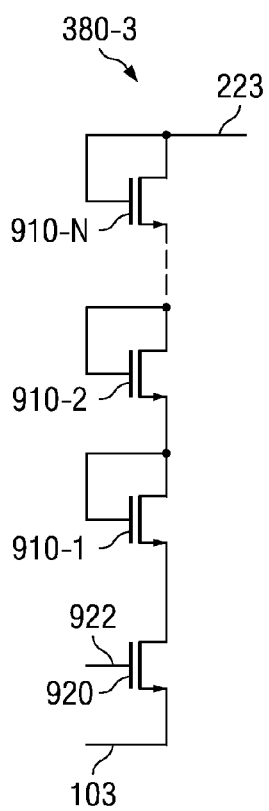
FIGS. 9 and 10 are circuit diagrams together illustrating the details of counter-leakage circuits in yet another embodiment.
Figure 10:
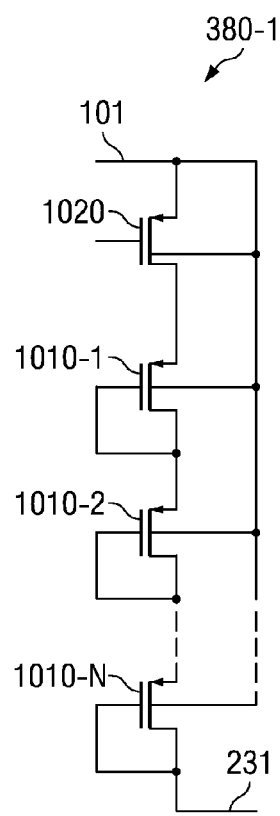

FIGS. 9 and 10 are circuit diagrams together illustrating the details of counter-leakage circuits 380-1 through 380-4 in another embodiment. In particular, FIG. 9 is a circuit diagram illustrating the details of counter-leakage circuit 380-3 and FIG. 10 is a circuit diagram illustrating the details of counter-leakage circuit 380-1.

For conciseness, only the details of counter-leakage circuits 380-1 and 380-3 are described herein. However, counter-leakage circuits 380-2 and 380-4 may also be implemented similar to 380-1 and 380-3 respectively. With reference to FIG. 9, counter-leakage circuit 380-3 is shown containing NMOS transistors 910-1 through 910-N and 920. Each component is described below.

Transistor 920 turns off counter-leakage circuit 380-3 according to a signal received on gate terminal 922. Transistor 920 turns off when the voltage level on path 922 represents logic 0, and disables counter-leakage circuit 380-3 since Vss 103 is not connected to transistors 910-1 through 910-N when transistor 920 is in an off state. Counter-leakage circuit 380-3 is operational when the voltage level on path 922 is at logic 1. The operation of counter-leakage circuit 380-3 is described below.

Each transistor 910-1 through 910-N operates as a diode since the gate terminal is connected to the drain terminal. Each transistor 910-1 through 910-N may be implemented with a small ratio of width to length (W/L). Each transistor 910-1 through 910-N turns on when the voltage on drain terminal is greater than the sum of cutting voltage of corresponding transistor and the voltage on source terminal (of the corresponding transistor). Transistor 910-N receives the voltage at node 223 on drain terminal. All transistors 910-1 through 910-N turn on when the voltage on node 223 reaches the sum of the cutting voltages of transistors 910-1 through 910-N.

Assuming that the cutting voltages of transistors 910-1 through 910-N are equal (Vt), then each transistor 910-1 through 910-N turns on when the voltage on node 223 equals N*Vt (wherein '*' represents a multiplication operator). Since the structure of transistors 910-1 through 910-N draws current when turned on, the voltage at node 223 may not change beyond (BIASN−Vt) by selecting transistors 910-1 through 910-N such that N*Vt equals (BIASN−Vt of transistor 320). Therefore, the voltage at node 223 may be controlled to be below (BIASN−Vt of transistor 320) by appropriate choice of number of transistors (N) and cutting voltages.

With reference to FIG. 10, counter-leakage circuit 380-1 is shown containing PMOS transistors 1010-1 through 1010-N and 1020. Transistors 1010-1 through 1010-N and 1020 operate similar to transistors 910-1 through 910-N and 920 respectively. However, the drain terminal of transistor 1010-N receives the voltage on node 231 and thus counter-leakage circuit 380-1 may not allow the voltage at node 231 to go beyond (BIASP+Vt of transistor 310).

It may be noted that several embodiments of counter-leakage circuits 380-1 through 380-4 (described above with reference to FIGS. 5 to 10) may reduce leakage of current at several nodes in input buffer 110. In addition, the circuits of FIGS. 5 to 10 may consume substantially low power since the transistors in the circuits are turned on only when the voltage at a node goes beyond the desired voltage level. Therefore, input buffer 110 may be provided with reduced leakage current and reduced power consumption.

However, it may be required to implement high voltage circuits performing several logic functions using low voltage transistors. The manner in which an inverter may be implemented is described below with reference to FIG. 11.

14. Inverter

Figure 11:
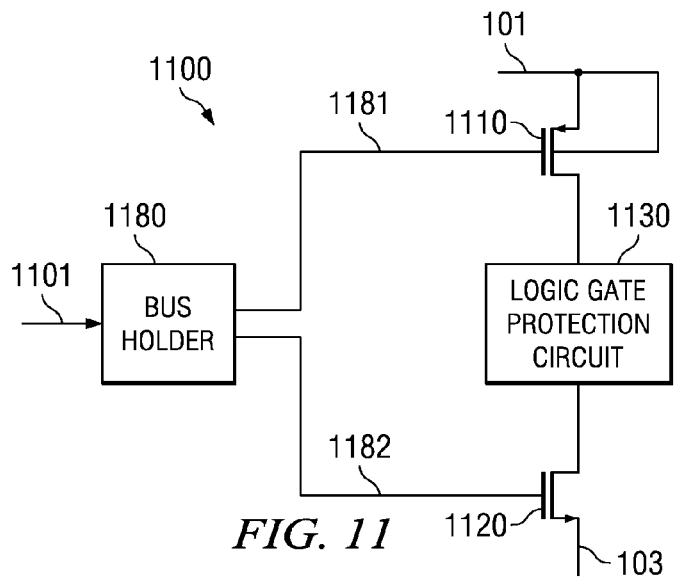
FIG. 11 is a block diagram illustrating the details of an inverter implemented using low voltage transistors in high voltage environment in an embodiment of the present invention.
Figure 12:
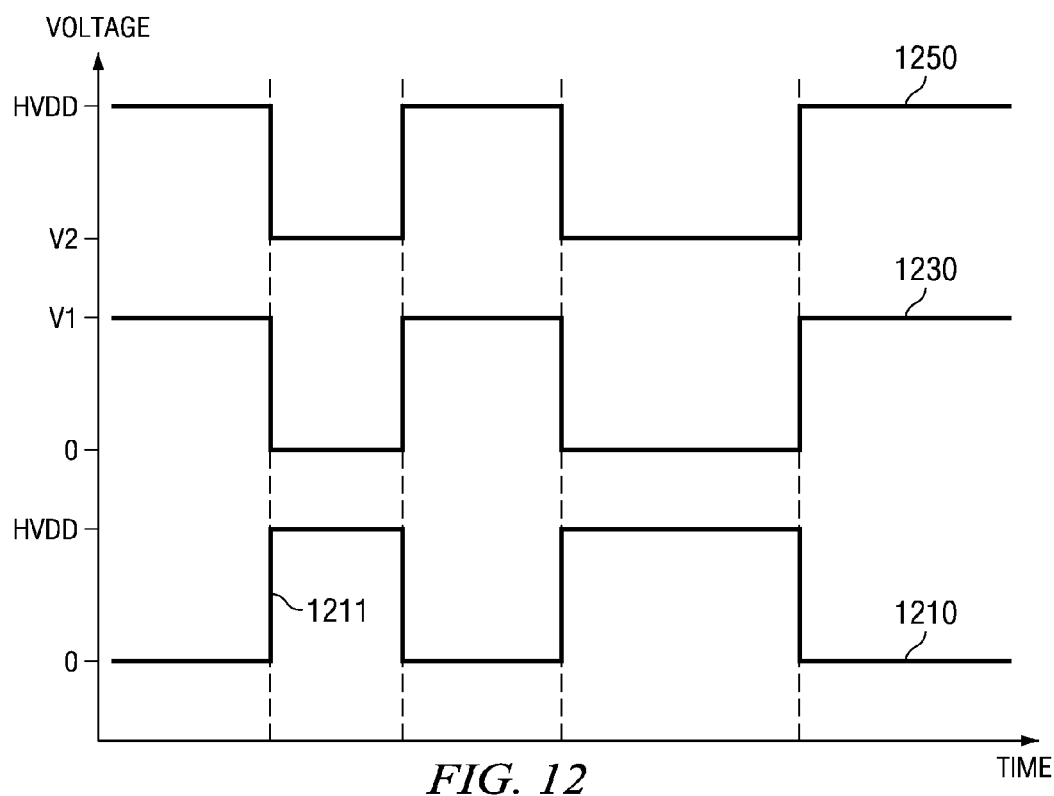
FIG. 12 is a timing diagram illustrating the details of swing signals provided as input to the components of an inverter.
Figure 13:
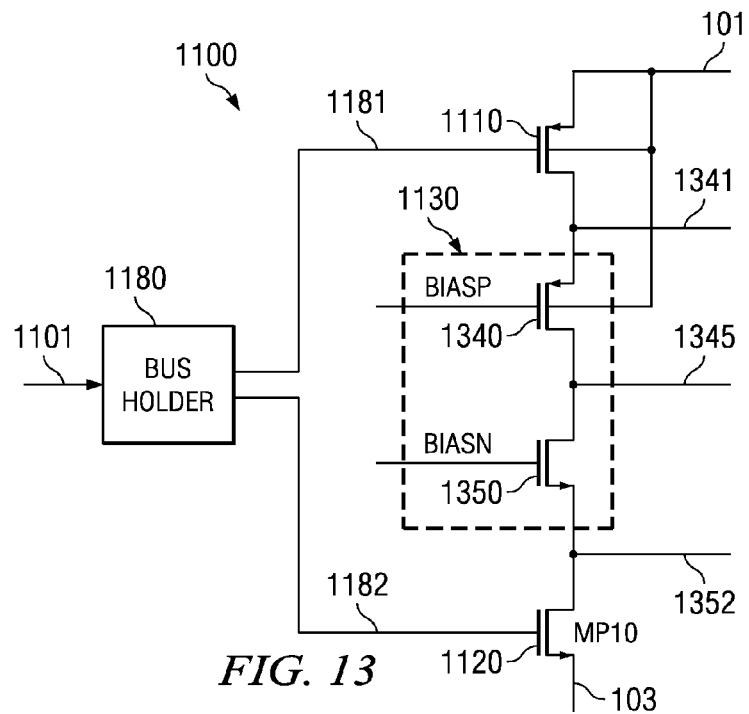
FIG. 13 is a circuit diagram of an inverter in an embodiment of the present invention.

FIGS. 11, 12 and 13 are diagrams together illustrating the details of an inverter implemented using low voltage transistors operating at a high voltage in an embodiment of the present invention. In particular, FIG. 11 is a block diagram illustrating the details of inverter 1100, FIG. 12 is a timing diagram illustrating the details of swing signals provided as input to the components in inverter 1100, and FIG. 13 is a circuit diagram corresponding to inverter 1100 of FIG. 11.

With reference to FIG. 11, inverter 1100 is shown containing PMOS transistor 1110, NMOS transistor 1120, logic gate protection circuit 1130 and bus holder 1180. Each component is described below.

Bus holder 1180 receives input signal on path 1101 and generates two signals on paths 1181 and 1182, each with different voltage levels, but representing the same logic values. Input signal 1101 is a high voltage signal, which switches between HVDD and Vss. Bus holder 1180 is an example of a swing spilt circuit, which generates multiple output signals with different voltage swings (amount of change in the voltage levels). Bus holder 1180 may be implemented similar to bus holder 240 of FIG. 2.

Transistors 1110 and 1120 together perform an inverting operation of the signal provided on gate terminals of both transistors 1110 and 1120. The gate terminals of transistors 1110 and 1120 are connected to paths 1181 and 1182 respectively, but both receive the voltage level representing the same logic value.

Logic gate protection circuit 1130 operates to ensure that transistors 1110 and 1120 are not exposed to voltages exceeding the corresponding allowed maximum voltage. Example implementation of logic gate protection circuit 1130 is described below with reference to FIG. 13 in further detail. The manner in which two swing signals on paths 1181 and 1182 may be generated is described below.

With reference to FIG. 12, wave forms 1210, 1230 and 1250 respectively represent input signal 1101, swing signal 1181 and another swing signal 1182. It is assumed that Vss 103 equals ground voltage (0V). Input signal 1210 is shown changing between 0V and HVDD. For example, input signal 1210 is shown at 0V before time point 1211 and at HVDD at time point 1211.

Swing signal 1230 is shown changing between 0V and V1. In an embodiment, V1 equals half of HVDD. In an embodiment of FIG. 3, the signal on path 235 (1182 in FIG. 11) switches between Vss 103 and BIASN−Vt representing logic 0 and 1 respectively. For example, swing signal 1230 is shown at V1 before time point 1211 and at 0V after time point 1211.

Swing signal 1250 is shown changing between V2 and HVDD. In an embodiment, V2 equals half of HVDD. The first intermediate signal on path 366 (1182 in FIG. 11) may switch between (BIASP+Vt) and HVDD representing logic 0 and 1 respectively. For example, when input signal 1101 represents logic 0, then the voltage level of the signal on paths 1181 and 1182 respectively equals HVDD 101 and (BIASN−Vt), with both representing logic 1.

With reference to FIG. 13, inverter 1100 is shown containing PMOS transistor 1340 and NMOS transistor 1350 together operating as protection circuit 1130, transistors 1110 and 1120 performing an inversion logic operation, and bus holder 1180. In an embodiment, all the transistors of inverter 1100 are of the same voltage specification, which is lower than the voltage level of the input signal received on path 1101.

The operation of each transistor is first described below with reference to the manner in which each transistor is not exposed to cross terminal voltages exceeding an allowed maximum voltage in the case of both transitions (0 to 1, and 1 to 0). The operation of transistors as an inverter is then described. For illustration, it is assumed that the voltage level corresponding to logic 1 equals HVDD and logic 0 equals Vss.

The description is continued with respect to state changes when input signal 1101 transitions to logic 0, and the manner in which transistors (forming inverter 1100) may be protected by logic gate protection circuit 1130.

Transistor 1340 is off when input signal 1101 is at logic 0 since the voltage level of the signal on path 1181 equals HVDD 101, which turns off transistor 1110. The turning off of transistor 1110 turns off transistor 1340, and as a result the voltage on path 1341 equals (BIASP+Vt).

Transistor 1110 may be protected due to the turning off of transistor 1340. In particular, Vds and Vdg of transistor 1110 would not be exposed to a voltage greater than (HVDD−BIASP−Vt of transistor 1340).

The description is continued with respect to state changes when input signal 1101 transitions to logic 1, and the manner in which transistors (forming inverter 1100) may be protected by logic gate protection circuit 1130.

Transistor 1350 is off when input signal 1101 is at logic 1 since the voltage level of the signal on path 1182 equals Vss, which turns off transistor 1120. The turning off of transistor 1120 turns off transistor 1350, and as a result the voltage on path 1352 equals (BIASN−Vt of transistor 1350).

Transistor 1120 may be protected due to the turning off of transistor 1350. In particular, Vds and Vdg of transistor 1120 would not be exposed to a voltage greater than (BIASN−Vt of transistor 1340-Vss).

Therefore, it may be appreciated that transistors 1110 and 1120 are protected due to turning off of transistors 1340 and 1350 respectively. While transistors 1340 and 1350 operate as a logic gate protection circuit as described above, transistors 1110 and 1120 together continue to operate as an inverter as described below.

15. Operation of an Inverter

When input signal 1101 is at logic 0, the voltage level of the signals on paths 1181 and 1182 equals HVDD 101 and (BIASP+Vt) respectively. The voltage level of the signal on path 1182 is enough to turn on transistor 1120, which pulls path 1352 to Vss 103. The turning on of transistor 1120 turns on transistor 1350. As a result, the voltage on path 1345 equals Vss 103. HVDD on path 1181 turns off transistor 1110, which causes transistor 1340 to be turned off. As a result, the voltage on path 1341 equals (BIASP+Vt of transistor 1340), which represents logic 0.

When input signal 1101 is at logic 1, the voltage level of the signals on paths 1181 and 1182 equals (BIASP+Vt) and Vss respectively. The voltage level of the signal on path 1181 is enough to turn on transistor 1110, which pulls path 1341 to HVDD. The turning on of transistor 1110 turns on transistor 1340. As a result, the voltage on path 1345 equals HVDD. Vss on path 1182 turns off transistor 1120, which causes transistor 1350 to be turned off. As a result, the voltage on path 1352 equals (BIASN−Vt of transistor 1350), which represents logic 1.

It may be noted that input signal 1101 is provided to bus holder 1180 before providing to transistors 1110 and 1120. In an embodiment, bus holder 1180 performs an inversion operation on input signal 1101 and generates inverted signal of 1101 on paths 1181 and 1182. Inverter 1100 performs inversion (inverting) operation on signals 1181 and 1182 according to an aspect of the present invention. Accordingly, the output on path 1345 represents the same logic level of signal on path 1101. It may be noted that to generate an inverted signal of input signal, another inverter similar to inverter 1100 may be cascaded.

Therefore, inverter 1100 can be implemented using low voltage transistors operated in high voltage environment. However, the same structure of protection circuit 1130 may be used to protect the transistors in any other logic gate implemented using low voltage transistors in high voltage environment. An example embodiment of a NAND gate using protection circuit 1130 is described below with reference to FIG. 14.

16. NAND Gate

Figure 14:
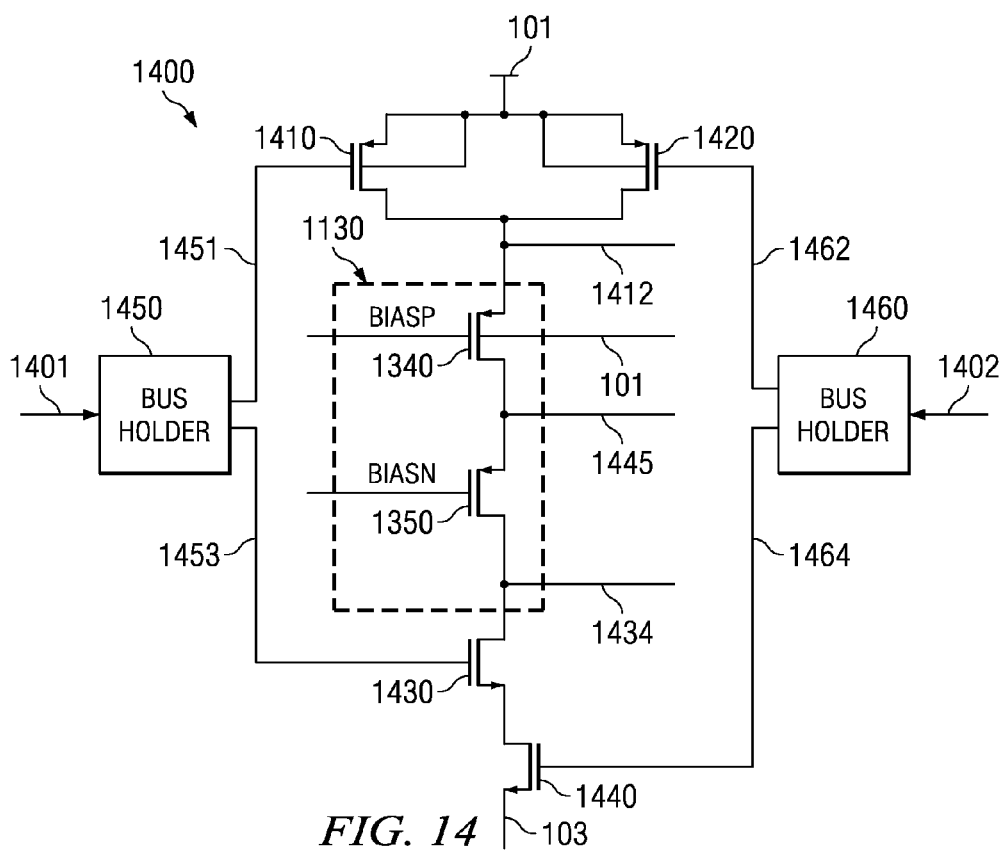
FIG. 14 is a circuit diagram illustrating the details of a NAND gate implemented using low voltage transistors in high voltage environment in an embodiment of the present invention.

FIG. 14 is a circuit diagram illustrating the details of a NAND gate implemented using low voltage transistors in high voltage environment in an embodiment of the present invention. For illustration, a two input NAND gate is described, however, multiple number of input NAND gate can be implemented similarly. NAND gate 1400 is shown containing PMOS transistors 1410 and 1420, NMOS transistors 1430 and 1440, bus holders 1450 and 1460, and protection circuit 1130. Each component is described below.

Bus holder 1450 receives one input signal on path 1401 and generates swing signals for transistors 1410 and 1430 on respective paths 1451 and 1453 similar to bus holder 1180. Similarly, bus holder 1460 receives another input signal on path 1402 and generates swing signals for transistors 1420 and 1440 on respective paths 1462 and 1464.

Transistors 1410, 1420, 1430 and 1440 together operate generally as a NAND gate by receiving signals on respective gate terminals on paths 1451, 1462, 1453 and 1464 as is well known in relevant arts. NAND gate 1400 performs NAND operation on input signals 1401 and 1402, and provides output with high voltage swing on path 1445 and with low voltage swing on paths 1434 and 1412.

Protection circuit 1130 containing transistors 1340 and 1350 protects transistors 1410, 1420, 1430 and 1440 from avoiding exposure to high voltages, similar to as described above with reference to FIG. 13.

In particular, transistors 1410 and 1420 may be protected due to the turning off of transistor 1340. For example, Vds and Vdg of transistors 1410 and 1420 would not be exposed to a voltage greater than (HVDD−BIASP−Vt of transistor 1340) due to the turning off of transistor 1340.

Similarly, transistors 1430 and 1440 may be protected due to the turning off of transistor 1350. For example, Vds and Vdg of transistors 1430 and 1440 would not be exposed to a voltage greater than (BIASN−Vt of transistor 1350-Vss) due to the turning off of transistor 1350.

Therefore, it may be noted that protection circuit 1130 may be used in logic gates implemented using low voltage transistors and operated in high voltage environment such that protection circuit 1130 may protect low voltage transistors from being exposed to high voltages.

Protection circuit 1130 may also be used to implement any combinatorial logic using low voltage transistors and operated in high voltage environments such that protection circuit 1130 may protect low voltage transistors from being exposed to high voltages. In addition, the logic gates described above (and combinatorial logic containing such gates) can be used as pre-driver 140.

Another aspect of the present invention provides enhanced hysteresis, which leads to better immunity (in the operation of a circuit) to noise in the corresponding input signal. Hysteresis provides positive feedback Schmitt trigger action on the input of certain circuits causing a dependence in circuit switching thresholds on the previous state of the circuits positive feedback loop. The circuits high and low threshold voltage will now exhibit "inertia" and the input will have to overcome this inertia by going beyond the required threshold (without hysteresis) in order to change the state of the positive feedback loop. This inertial property of the receiver is generally referred to as hysteresis. The desired response due to enhanced hysteresis is described below first.

17. Hysteresis

Figure 15:
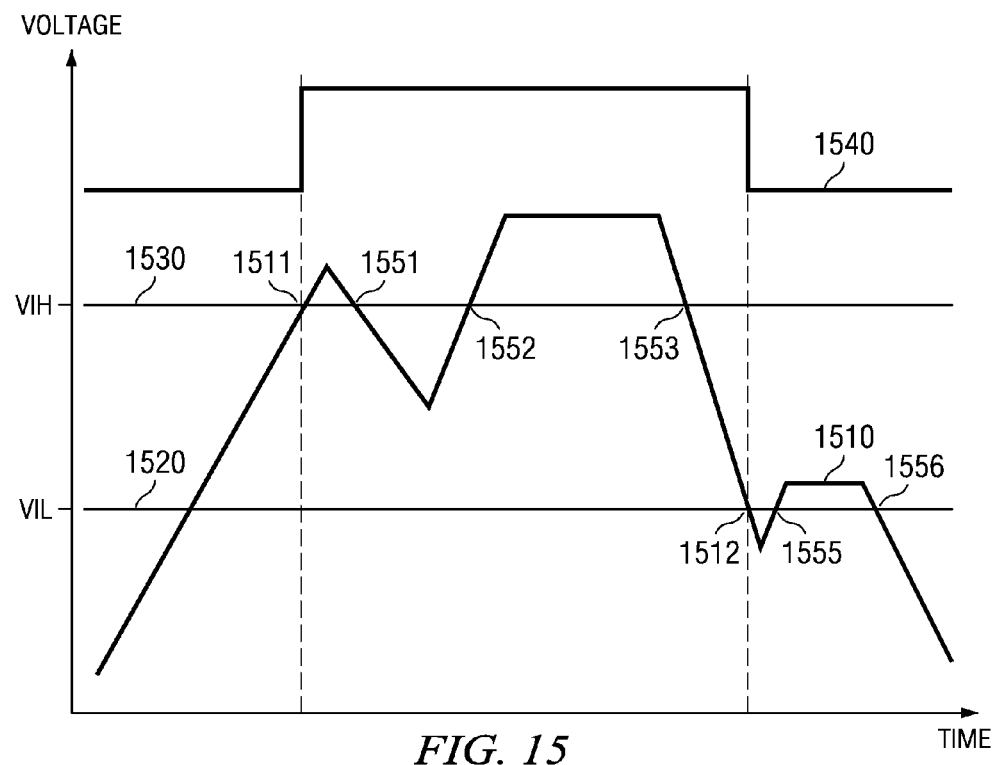
FIG. 15 is a timing diagram illustrating the desired response of an input buffer exhibiting hysteresis.

FIG. 15 is a timing diagram illustrating the desired response with enhanced hysteresis in one embodiment. Wave forms 1510 and 1540 respectively represents input signal received on path 201 and output signal provided on path 299. Voltage levels (VIL and VIH) 1520 and 1530 respectively represent the higher and lower hysteresis threshold voltages, which determine the voltage level of output signal 1540 at any time point.

Output signal 1540 needs to change from a logic 0 to 1 if input signal 1510 rises above VIH 1530. The corresponding transition is shown at time point 1511. Output signal 1540 needs to change from logic 1 to 0 if input signal 1510 falls below VIL 1520, and the corresponding transition is shown at time point 1512.

A circuit exhibiting hysteresis should not transition the output values if the input signal fluctuates in the region between VIL 1520 and VIH 1530. The fluctuations are usually due to noise and the absence of transitions indicates a high signal-to-noise-ratio (SNR). The absence of such transitions in output signal 1540 are shown in time durations 1551-1552, 1553-1512, and 1555-1556.

The manner in which hysteresis may be implemented is described below with reference to FIG. 16.

18. Input Buffer Containing Hysteresis

Figure 16:
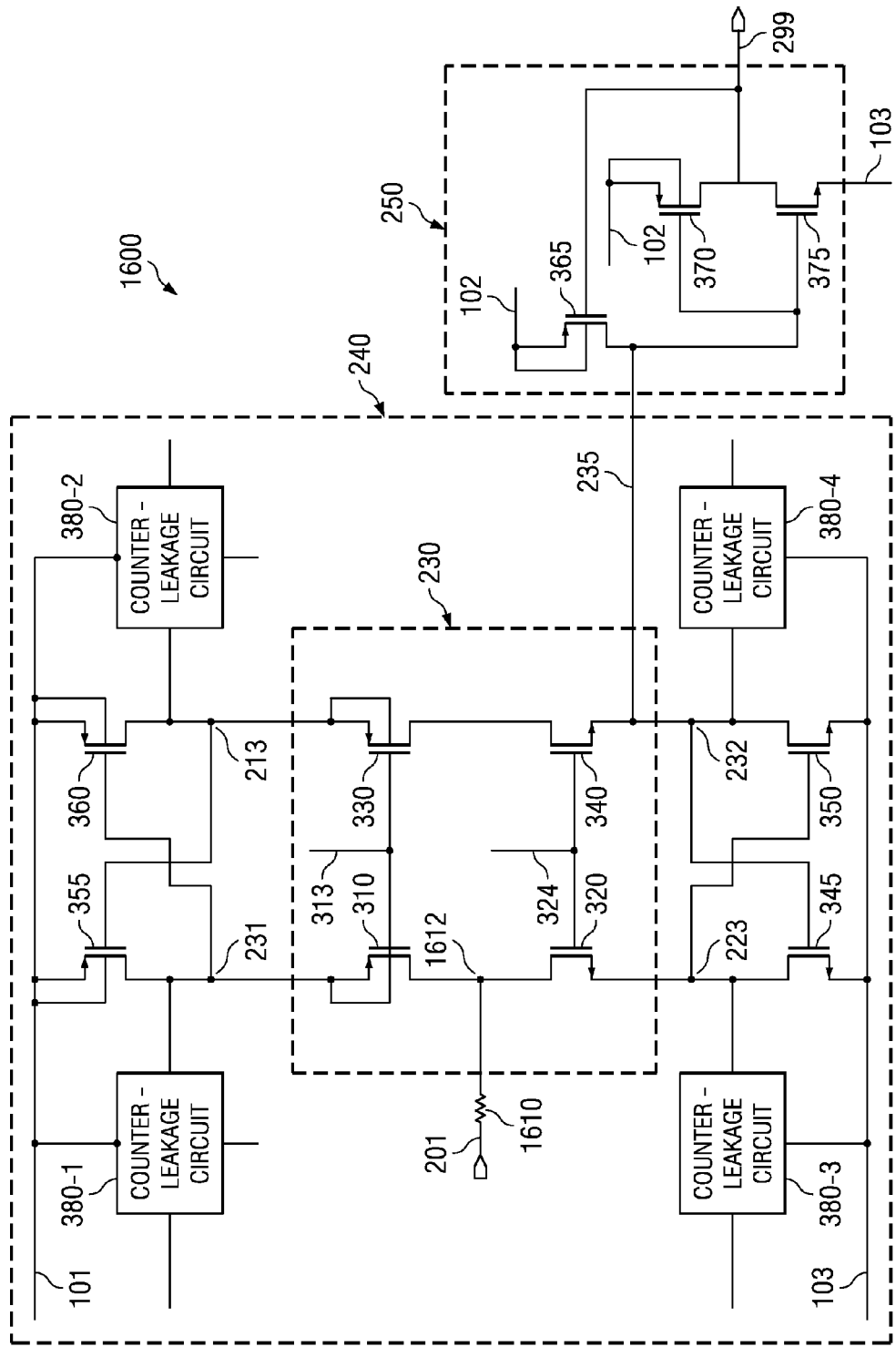
FIG. 16 is a circuit diagram illustrating the manner in which hysteresis may be implemented in an input buffer in an embodiment of the present invention.

FIG. 16 is a circuit diagram of an input buffer illustrating the details of hysteresis in an embodiment of the present invention. Input buffer 1600 is shown containing all the components of FIG. 3 and resistor 1610. Resistor 1610 enables input buffer 1600 to provide hysteresis and thereby attaining high signal to noise ratio.

Hysteresis can be introduced by increasing the sizes of transistors 355 and 310 to reduce VIL and increasing the sizes of transistors 320 and 345 to increase VIH. By increasing the sizes of transistors 310 and 355, impedance of the path from node 1612 through transistors 310 and 355 decreases, as compared to impedance of resistor 1610 and thus the path containing transistors 310 and 355 controls the voltage at node 1612 (rather than resistor 1610).

Since transistors 310 and 355 will be turned off when input signal 201 is at logic 0, even if the voltage level of input signal goes above VIL set by transistors 310 and 355 and below VIH, transistors 310 and 355 will remain turned off. Similarly, VIH is adjusted by increasing the sizes of transistors 320 and 345.

In reality, output drivers that provide input signal 201 have an output impedance and these will compete with the pull up arm (comprising of transistors 355 and 310) and pull down arm (comprising of transistors 320 and 345) for the voltage at the drain terminals of transistors 310 and 320.

The pull down arm of the driver (not shown) will compete with the pull up arm (transistors 355 and 310) of input buffer 1600 and similarly the pull up of the driver (not shown) will compete with pull down arm (transistors 320 and 345) for control of voltage at node 1612.

If the output impedance is insufficient to provide the desired hysteresis, the deficiency can be filled by including resistor 1610 (either external or internal (like an nwell or poly resistor) which acts in series with the output impedance of the output driver. Increasing the resistance of resistor 1610 will increase the hysteresis of the circuit.

Thus, integrated circuits provided according to features described above may be implemented in various types of devices. An example device is described below in detail.

19. Example Device

Figure 17:
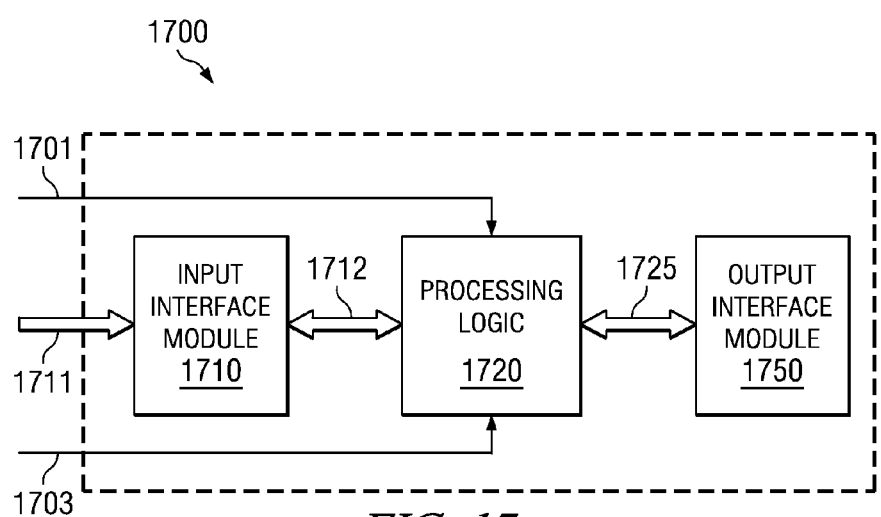
FIG. 17 is a block diagram illustrating an example device in which various aspects of the present invention can be implemented.

FIG. 17 is a block diagram illustrating an example device in which various aspects of the present invention can be implemented. Example device 1700 is shown containing input interface module 1710, processing logic 1720 and output interface module 1750. Each block is described below.

Input interface module 1710 may provide a suitable interface to receive input signals from various external sources. Examples of such external sources include other devices as well components such as keyboards, networks, etc. The signals may be received on path 1711 and provided in a suitable format on path 1712 (after any desired processing). Similarly, output interface module 1750 provides a suitable interface to transfer the signals received on path 1725 to external sources (e.g., other devices, display unit, networks, etc.).

Processing logic 1720 processes the signals received on path 1712 and provides the output signals to be transmitted to external device(s) on path 1725. Processing logic 1720 may be implemented with low voltage transistors operating with a high voltage supply received on path 1701. The voltage level of supply voltage 1701 is referred with reference to a reference voltage received on path 1703. Processing logic 1720 can be implemented using the various techniques described above with reference to integrated circuit 100 of FIG. 1.

20. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

The invention claimed is:

1. A protection circuit associated with a first PMOS transistor of a voltage specification of a first voltage level, said first PMOS transistor and said protection circuit being comprised in an integrated circuit designed to process information in an input signal having a swing equaling a second voltage level, wherein said first voltage level is lower than said second voltage level, said protection circuit comprising:

a second PMOS transistor which switches to an off state if said input signal having said swing would cause a cross terminal voltage of said first PMOS transistor to exceed a permissible range, wherein said second PMOS transistor in said off state ensures that said cross terminal voltage of said first PMOS transistor does not exceed said permissible range;

a first NMOS transistor also of said voltage specification of said first voltage level;

a second NMOS transistor which switches to an off state if said input signal would cause a cross terminal voltage of said first NMOS transistor to exceed a permissible range, wherein said second NMOS transistor in said off state ensures that said cross terminal voltage of said first NMOS transistor does not exceed said permissible range.

2. The protection circuit of claim 1, wherein a source terminal of said first PMOS transistor being connected to a supply voltage of said second voltage level.

3. The protection circuit of claim 2, wherein said input signal swings between a reference voltage and said second voltage level.

4. The protection circuit of claim 1, wherein an upper limit of said permissible range equals an allowed maximum voltage associated with each of said first PMOS transistor and said first NMOS transistor.

5. The protection circuit of claim 4, said protection circuit further comprising:

a third NMOS transistor, a gate terminal of said third NMOS transistor being connected to said second bias voltage, a source terminal of said third NMOS transistor being connected to a gate terminal of said first NMOS transistor, a drain terminal of said first NMOS transistor being connected to a source terminal of said second NMOS transistor, and a source terminal of said first NMOS transistor being connected to a reference voltage, wherein said third NMOS transistor ensures that a gate to source voltage (Vgs) and a gate to drain voltage (Vgd) of said first NMOS transistor from being exposed to voltage exceeding said permissible range.

6. The protection circuit of claim 5, wherein said input buffer further comprises a fourth NMOS transistor, a gate terminal of said fourth NMOS transistor being connected to said source terminal of said second NMOS transistor, a drain terminal of said fourth NMOS transistor connected to said source terminal of said third NMOS transistor, and a source terminal of said fourth NMOS transistor being connected to said reference voltage.

7. The protection circuit of claim 6, wherein all of said first NMOS transistor, said second NMOS transistor, said third NMOS transistor, and said fourth NMOS transistor are of said voltage specification of said first voltage level.

* * * * *